United States Patent [19]

Matsumoto et al.

[11] Patent Number: 5,448,188
[45] Date of Patent: Sep. 5, 1995

[54] SIGNAL PROCESSING DEVICE FOR PROVIDING A SIGNAL CORRESPONDING TO AN INPUT SIGNAL AND FOR PROVIDING A SIGNAL WHICH DOES NOT CORRESPOND TO THE INPUT SIGNAL

[75] Inventors: Motoaki Matsumoto, Kanagawa; Yoshihiko Sato, Tokyo, both of Japan

[73] Assignee: Fuji Photo Film Co., Ltd., Kanagawa, Japan

[21] Appl. No.: 223,303

[22] Filed: Apr. 4, 1994

Related U.S. Application Data

[63] Continuation of Ser. No. 117,738, Sep. 8, 1993, abandoned, which is a continuation of Ser. No. 800,109, Nov. 29, 1991, abandoned.

[30] Foreign Application Priority Data

Nov. 30, 1990 [JP] Japan .................. 2-336441
Nov. 30, 1990 [JP] Japan .................. 2-336442

[51] Int. Cl.$^6$ ............................................. H03K 5/24
[52] U.S. Cl. .......................................... 327/65; 327/78; 327/82; 327/198; 327/291; 327/312; 327/482; 327/563; 327/355
[58] Field of Search ............... 307/254, 272.3, 289, 307/355, 358, 362, 455, 493, 494, 498, 364, 529, 540, 547, 548, 549, 550, 555, 562

[56] References Cited

U.S. PATENT DOCUMENTS

| | | | |
|---|---|---|---|
| 4,237,387 | 12/1980 | Devendorf et al. | 307/203 |
| 4,336,465 | 6/1982 | Nakano et al. | 307/238.3 |
| 4,546,272 | 10/1985 | Suzuki et al. | 307/455 |
| 4,553,046 | 11/1985 | Alzati et al. | 307/289 |
| 4,713,560 | 12/1987 | Herndon | 307/455 |
| 4,717,838 | 1/1988 | Brehmer et al. | 307/355 |
| 4,743,783 | 5/1988 | Isbell et al. | 307/498 |
| 4,800,298 | 1/1989 | Yu et al. | 307/548 |
| 4,810,908 | 3/1989 | Suzuki et al. | 307/269 |
| 4,864,155 | 9/1989 | Schmitz | 307/540 |
| 4,965,468 | 10/1990 | Nicollini et al. | 307/362 |
| 4,970,406 | 11/1990 | Fitzpatrick et al. | 307/272.1 |
| 5,001,370 | 3/1991 | Phan et al. | 307/549 |
| 5,013,938 | 5/1991 | Estrada | 307/455 |
| 5,025,179 | 6/1991 | Freitas | 307/555 |
| 5,140,175 | 8/1992 | Yagi et al. | 307/270 |
| 5,140,191 | 8/1992 | Nogle et al. | 307/270 |

*Primary Examiner*—Terry D. Cunningham
*Attorney, Agent, or Firm*—Sughrue, Mion, Zinn, Macpeak & Seas

[57] ABSTRACT

A signal processing device for selectively producing as an output signal either a signal corresponding to an input signal r a signal which may be a fixed voltage level for muting purposes or a mixed signal. A current switch composed of pairs of differential transistors switches among a plurality of current paths in accordance with a difference between the voltage levels of a pair of input signals varying in level in phase opposition to each other, or in accordance with a difference between the voltage levels of a reference voltage and a signal phase input signal. A load circuit composed of a plurality of resistors is connected in series with one of the current paths. A current bypass forming circuit which forms a current bypass of a constant current at a desired timing corresponding to a pulse signal with respect to the current path forming the load circuit effects the generation of an output signal not corresponding to the input signal, that is, a fixed voltage for muting the mixed signal.

14 Claims, 14 Drawing Sheets

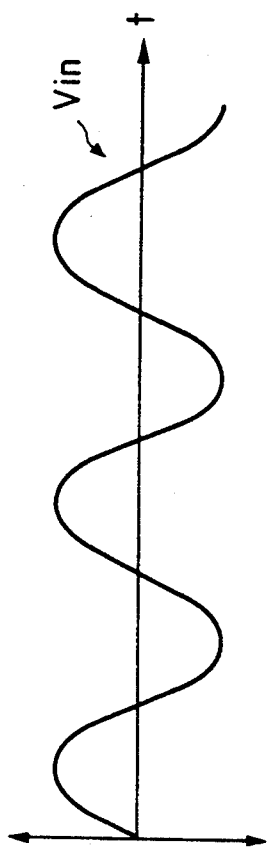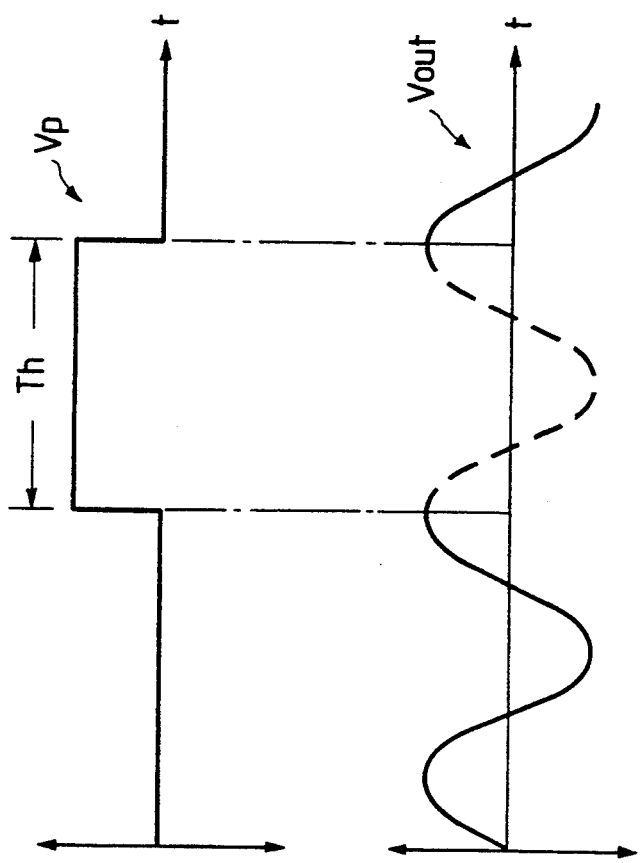
FIG. 3(a)   FIG. 3(b)   FIG. 3(c)

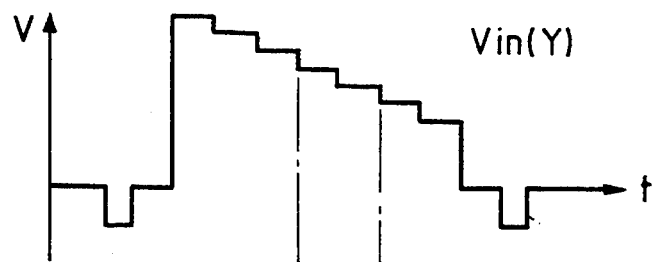
FIG. 12(a)
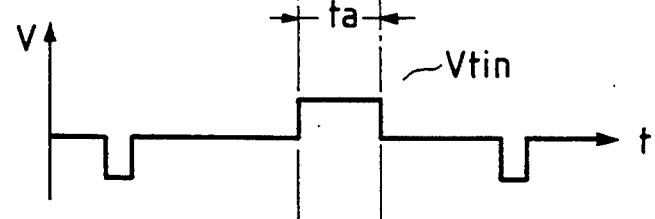
FIG. 12(b)
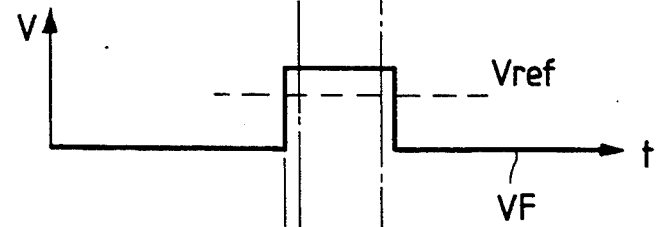
FIG. 12(c)
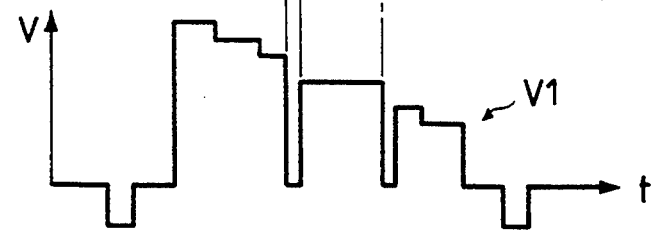
FIG. 12(d)
FIG. 13
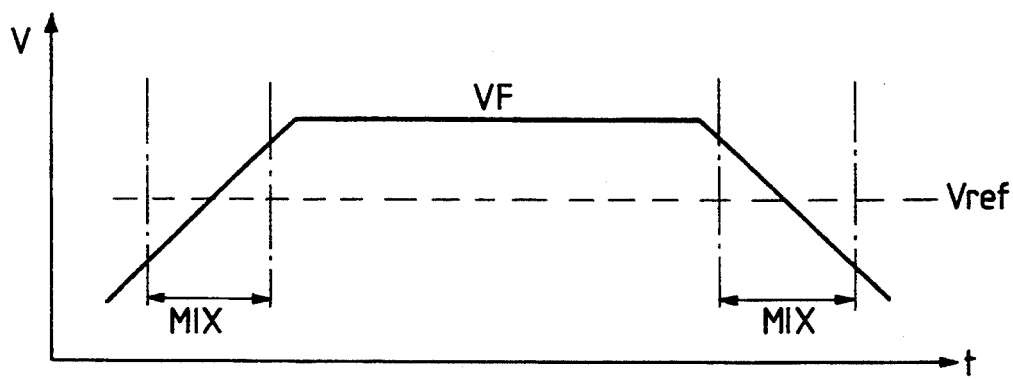

TRUTH TABLE

| VS1 | VS2 | VF1 | VF2 | VF3 | VF4 |
|-----|-----|-----|-----|-----|-----|
| H | H | H | L | L | L |
| H | L | L | H | L | L |
| L | H | L | L | H | L |
| L | L | L | L | L | H |

SIGNAL PROCESSING DEVICE FOR PROVIDING A SIGNAL CORRESPONDING TO AN INPUT SIGNAL AND FOR PROVIDING A SIGNAL WHICH DOES NOT CORRESPOND TO THE INPUT SIGNAL

This is a continuation of application Ser. No. 08/117,738 filed Sep. 8, 1993, now abandoned, which is a continuation of application Ser. No. 07/800,109 filed Nov. 29, 1991, now abandoned.

BACKGROUND OF THE INVENTION

The present invention relates to a signal processing device for transmitting and controlling an analog signal and for inserting a desired signal. In particular, the invention relates to a circuit which is ideal for use when an output signal corresponding to an analog signal is converted to a direct current voltage level during a desired period, or when a desired signal is inserted in an input signal transmission path.

As a device which is used to suppress temporarily the transmission of an input signal while the input signal is being transmitted is known a muting circuit. When, for example, a brightness signal of a video apparatus is muted, if the transmission of the brightness signal is simply suppressed, then the brightness of the reproduced video image is not constant so that the video image is hard to view. Also, as disclosed in Television Technology, July, 1989, p. 20–21, video apparatus have been developed in recent years having multiple functions. However, in such recent multi-function video apparatus, if a reference level during transmission of a signal, whether it is a brightness (luminance) signal or a color (chrominance) signal, is varied, then the brightness or color tone of the reproduced video image is caused to vary.

In view of the above-mentioned problem, for example, when the brightness signal is muted, then the brightness signal must be set as a d.c. voltage at a desired level, which requires an offset adjustment. On the other hand, because the video circuitry in recent apparatus is implemented with ICs, the offset adjustment must be performed by an adjusting element mounted externally to the IC. Such an arrangement takes much labor and long time for adjustment and also requires externally mounted parts, which results in increased manufacturing costs. Also, due to the fact that the externally mounted parts have a temperature dependence different from that of the circuit elements included within the IC, it is difficult to maintain a stable d.c. offset voltage when temperatures vary.

The present invention further relates to a signal processing device which produces output signals separately or in a mixed manner respectively corresponding to a plurality of input signals, and, in particular, to a circuit construction for use in stabilizing mixing of a plurality of signals in a signal transmission path in a video apparatus.

In recent years, there has been developed a video camera which is able to combine two picture screens, as disclosed in Television Technology, July 1989, pp. 25–26. Combination of two picture screens is achieved by means of an electronic volume control called a "linear gate" by the persons skilled in the art. With this circuit, the time for combining signals, designated a "MIX" time, can be adjusted by controlling the level of a control voltage.

In the conventional linear gate, there are provided a pair of differentially connected current switches in a transmission path for two input signals to be mixed, that is in a current path for the two input signals, so that an output signal can be obtained from a single load resistor. That is, in the linear gate according to the prior art, it is not possible to obtain two output signals which respectively have forward and reverse phases. In providing the video apparatus with multiple functions and simplifying the circuit arrangement of a multi-function video apparatus, it is very convenient to be able to provide two output signals having opposite phases.

However, according to the prior art structure, because only one output signal can be obtained, to obtain an output signal having an opposite phase, it is necessary to provide a phase inverter circuit, which results in a complicated circuit arrangement.

Also, according to the conventional structure, the pedestal levels of the input signals can easily be varied, the time for mixing the two input signals is short, and the structure can easily be influenced by power and temperature variations.

SUMMARY OF THE INVENTION

The present invention directed at eliminating the drawbacks found in the above-mentioned conventional signal processing devices. Accordingly, it is an object of the invention to provide a signal processing device which employs a simplified circuit arrangement to eliminate externally mounted parts so as to maintain a high degree of circuit integration and at the same time not only provide an output signal accurately corresponding to an input signal, but also producing an output signal of a desired voltage level which does not correspond to an input signal.

In order to accomplish the above object, according to the invention, there is provided a signal processing device which comprises: a current switch which is composed of, for example, a pair of differential transistors to switch among a plurality of current paths in accordance with a difference between the voltage levels of a pair of input signals varying in level in phase opposition to each other or in accordance with a difference between the voltage levels of a reference voltage and a signal phase input signal; a load circuit composed of a plurality of resistors and connected in series between one of the above current paths, for example, a power supply and the collector of one of the transistors, to obtain an output signal corresponding to the above input signals as well as produce an output signal which does not correspond to the input signal; and a current bypass forming circuit which forms a current bypass of a constant current at a desired timing corresponding to a pulse signal with respect to the current path forming the load circuit, and which generates an output signal not corresponding to the input signal, that is, a d.c. voltage in accordance with the voltage drop of the load circuit.

Also, in order to attain the above object, according to the invention, the current bypass forming circuit is used to form a plurality of current bypasses which are respectively different in the amount of current from one another.

According to the signal processing device constructed in the above-mentioned manner, when no current bypass is formed by the current bypass forming circuit, then there can be obtained an output signal corresponding to an input signal due to the operation of the current switch circuit formed of a pair of differentially connected transistors and due to the operation of the load resistor. On the other hand, when a current bypass is formed by the current bypass forming circuit, then a previously set current of the current bypass is allowed to flow through the load circuit, and the voltage level of the output signal can be determined by the voltage drop corresponding to the amount of such current. Also, by forming a plurality of current bypasses carrying respective different amounts of current and then by selectively driving the current bypasses by means of the current bypass forming circuit, the voltage level of the output signal can be set at a desired voltage level.

Accordingly, it is a further object of the invention to provide a signal processing device which is able to provide two output signals respectively corresponding to input signals and having opposite phases and which can produce a mixed output signal, and also which is able to reduce influences by external disturbances such as power variations, temperature variations and the like.

In order to accomplish the above and other objects, according to the invention, there is provided a signal processing device which comprises: a plurality of clamping circuits for setting up a reference level for input signals to be supplied separately from one each other such as a brightness signal or a color signal, as well as a title signal to be inserted into these input signals; a first current switch circuit for switching current paths according to the input signals such as the brightness signal, title signal and the like for which a reference level has been set up; and, a second current switch circuit disposed on the output side, for example, on the collector side of the first current switch circuit for selectively switching between load circuits formed of, for example, a load resistor and current paths other than the load circuit by means of comparison of a reference voltage and a control signal such as a fade signal or the like, the second current switch circuit being capable of arbitrarily setting a width of a time necessary for such switching operation.

According to the signal processing device constructed in the above-mentioned manner, there can be obtained output signals which respectively correspond to an input signal such as a brightness signal and the like and, at the same time, by switching the level setting of the above control signal while normal signal processing is being performed, that is, by changing the control signal from the low level to the high level, there can be obtained an output signal which is mixed with the title signal or the like. In addition, the above second current switch circuit is formed of a differential amplifier which is composed of a pair of transistors, so that it is able to switch between current paths by means of comparison of the reference voltage with the control signal. For this reason, a width of time for switching between current paths can be adjusted by means of the emitter resistances of the pair of transistors, so that there can be obtained two kinds of output signals respectively having opposite phases.

BRIEF DESCRIPTION OF THE DRAWINGS

FIGS. 3(a)-3(c) are waveform charts used to explain a circuit operation according to the invention;

FIGS. 12(a)-12(d) constitute a waveform chart used to explain the circuit operation of the seventh embodiment of the invention;

FIG. 13 is an explanatory diagram of a mixing operation according to the invention;

DESCRIPTION OF TEE PREFERRED EMBODIMENTS

Figure 1:
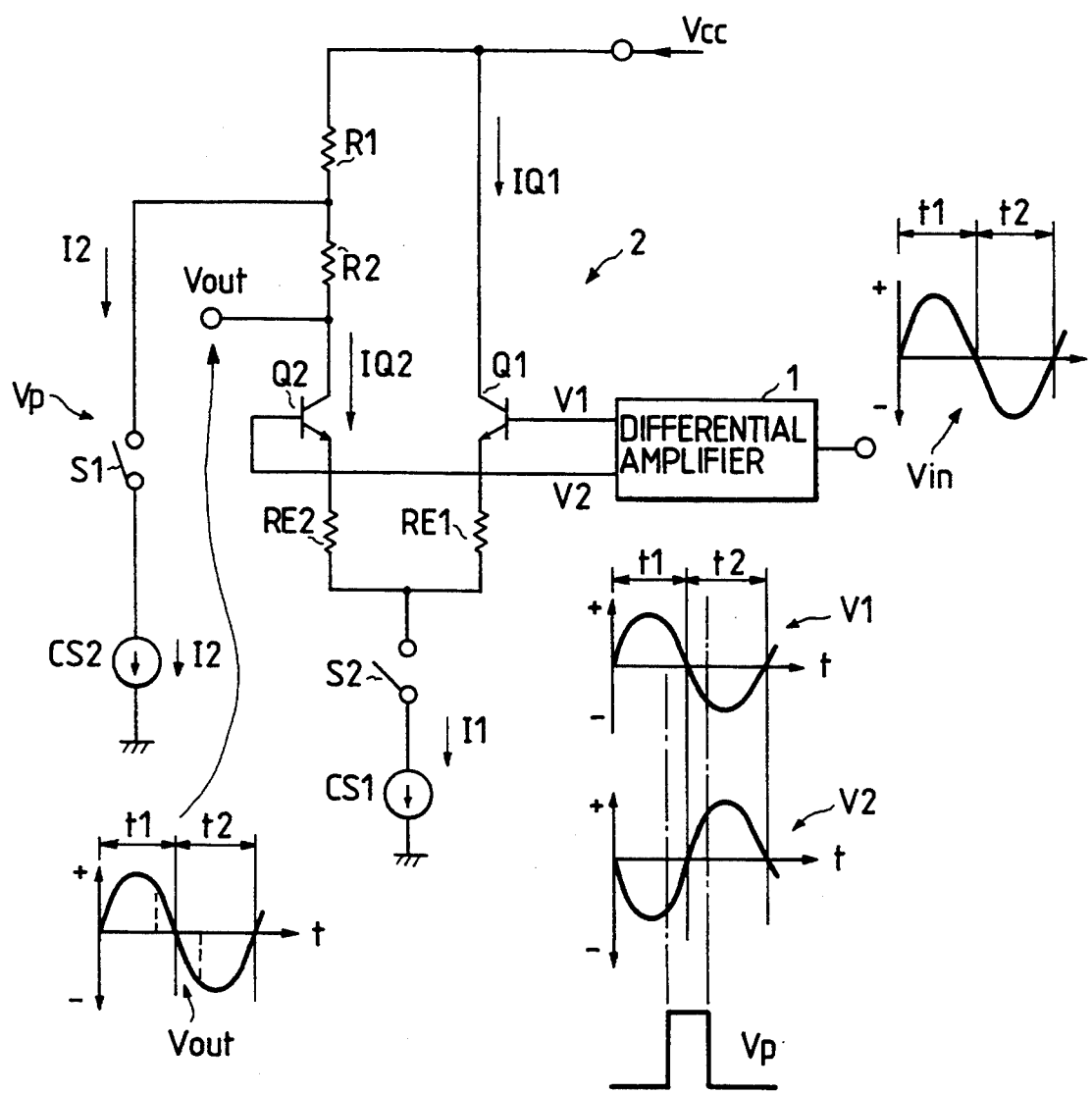
FIG. 1 is a circuit diagram of a first embodiment of a signal process sing device according to the invention, illustrating the basic structure of the invention.

A description will hereunder be given of a first embodiment of a signal processing device according to the invention with reference to FIG. 1. In the first embodiment, description will be given of a basic circuit arrangement and the basic operation of the present invention. A more specific and detailed description of the present invention will follow with respect to the second and following embodiments of the invention sequentially.

In FIG. 1, a differential amplifier 1 is used to amplify an input signal Vin and supply output voltages V1 and V2, which are 180° out of phase with each other, to a current switch circuit 2 disposed just downstream of the amplifier 1. The current switch circuit 2 is composed of a pair of transistors Q1 and Q2, resistors RE1 and RE2 for providing linearity, and a constant current circuit CS1 for setting the current of the current switch circuit 2.

Load resistors R1 and R2 correspond to the load circuit employed in the present invention, the load resistors R1 and R2 being used to perform current/voltage conversion and set a d.c. voltage for muting. A muting switch S1 and a constant current circuit CS2 for regulating the muting current correspond to the current bypass forming circuit employed in the present invention. If the switch S1 is driven on, then a current bypass can be formed. When the switch S1 is on, if the switches S1 and S2 are turned off at the same time, then the current of the circuit CS1 is prevented from flowing through the load resistors R1 and R2.

In order to position the muting output voltage at the center of a signal voltage for nonmuting, the resistance values of the load resistors R1 and R2 are set such that R1=R2, the current amounts of the currents I1 and I2 respectively regulated by the constant current circuits CS1 and CS2 are set such that I1=I2, and the following equation is obtained:

$$I1 = IQ1 + IQ2,$$

$$V1 - RE1 \times IQ1 - (Vbe(Q1)) = V2 - RE2 \times IQ2 - Vbe(Q2).$$

The final output signal Vout of the signal processing device can be obtained by means of the voltage drop across the load resistors R1 and R2.

Next, a description will be given below of the circuit operation of the inventive signal processing device. For a normal amplifying operation, the switch S1 is turned off and the switch S2 is turned on. When an analog input signal Vin as shown right in FIG. 1 is supplied to the differential amplifier 1, then output voltages V1 and V2 180° out of phase with each other are obtained from the differential amplifier 1, and these voltages V1 and V2 are applied to the respective bases of the transistors Q1 and Q2, respectively. During a period of t1 (V1>V2), the collector-emitter current IQ1 of the transistor Q1 is increased while the collector-emitter IQ2 of the transistor Q2 is decreased in inverse proportion to the increased current IQ1.

Therefore, the current IQ2 flowing through the load resistors R1 and R2 is also decreased, and the voltage level of the output signal Vout, which is determined by the equation IQ2×(R1+R2), becomes Vcc−(R1+R2)×IQ2, which is a voltage level near to the voltage supply Vcc because the current value of IQ2 is small.

On the other hand, during a period of t2 (V1<V2), the current IQ2 of the transistor Q2 is increased, while the current IQ1 of the transistor Q1 is decreased. The voltage level of the output signal Vout determined by IQ2×(R1+R2) becomes Vcc−(R1+R2)×IQ2, which is a small voltage level because the current value of IQ2 is increased. For this reason, when the switch S1 is set off and the switch S2 is set on, then there can be obtained an output signal Vout which corresponds to the input signal Vin.

Next, a description will be given below of the circuit operation of the inventive signal processing device when the switch S1 is set on and the switch S2 is set off.

If the switch S2 is set off and further the switch S1 is set on by means of a pulse signal Vp having a given pulse width, then there is formed a current bypass which extends through the switch S1 to the constant current circuit CS2. Also, because the switch S2 is off, the current IQ2 is prevented from flowing through the resistors R1 and R2. While the current bypass is active, a current I2 flows regardless of the input signal. Since I1=I2, if the current I2 flows through the constant current circuit CS2, then the current IQ2 is prevented from flowing through the current path of the transistor Q2 and no voltage drop due to the resistor R2 occurs. However, since the voltage to be determined by I2×R1 is applied to the collector of the transistor Q2, the voltage level of the output signal Vout becomes Vcc−I2×R1. Since R1=R2, I1=I2, the voltage level of the output signal Vout turns out to be one-half of the voltage level during the normal operation.

In other words, when the switch S1 is set on and the switch S2 is set off, then the level of the output signal Vout does not correspond to the level variations of the input signal Vin, and the signal is muted. Moreover, the level of the output signal Vout during the muting period is always set at one-half the normal operation voltage level, as shown by dotted lines within the waveforms of the output signal, that is, it is always set at the middle level of the normal operation voltage level.

Therefore, it is not necessary to provide a current adjustment device or the like which to adjust the muting voltage level. Also, since the current I2 is stabilized, the muting level is set to be constant, so that the level adjustment for transmitting and receiving signals can be made with ease, and thus a multi-purpose use is possible. Further, it is not necessary to provide means for adjusting current, voltage and the like. In addition, since the present circuit employs a differential input system, the present circuit is free from variations in the d.c. levels of the voltages V1 and V2.

Next, a description will be given below of a second embodiment of a signal processing device constructed according to the invention with reference to FIGS. 2 and 3. In the second embodiment, parts which perform the same functions as in the first embodiment are given the same designations and a further description thereof will be omitted.

A double-emitter transistor Q3 performs the same operation as the switch S1 discussed in the first embodiment, and the transistor Q3 serves also as the switch S2 shown in FIG. 1.

The respective emitters of the transistor Q3 are connected through resistors RE1 and RE2 to a constant current circuit CS1. Therefore, when the transistor Q3 is turned on, then there is formed a current bypass which extends from the resistor R1 through the transistor Q3 to the constant current circuit CS1. A current which flows through the current bypass becomes a current I1, and the current is muted in a similar manner to the above-mentioned case.

A pulse signal Vp, which is used to switch between the muting operation and the normal operation, is supplied from a pulse generation circuit (not shown). The pulse signal Vp is set during the muting operation to its high level (Vp>V1 and Vp>V2) to thereby drive the transistor Q3 on. Also, in the normal operation, the pulse signal Vp is set in its low level (Vp<V1 and Vp<V2) so as to keep the transistor Q3 in the off state. An output signal Vout is obtained from an output transistor Q4, which is connected as an emitter follower. A constant current circuit CSe is a constant current source for the output transistor Q4.

Next, a description will be given below of a circuit operation to be performed by the second embodiment.

At first, in the normal operation, the pulse signal Vp is set at the low level (Vp<V1 and Vp<V2) and the transistor Q3 is turned off. Therefore, in the normal operation, the action of the transistor Q3 can be ignored completely. An input signal Vin as shown in FIG. 3(a) is supplied to the differential amplifier 1. Output voltages V1 and V2, which are differentially amplified and are 180° out of phase with each other, are supplied to the respective bases of the transistors Q1 and Q2. The transistors Q1 and Q2 perform an amplifying operation similar to the case discussed with reference to the first embodiment. The amounts of currents IQ1 and IQ2 are increased and decreased according to the level variations of the input signal Vin. The collector voltage Vo of the transistor Q2 provides a voltage level which can be determined by $Vcc-IQ2\times(R1+R2)$, and this voltage level is varied according to the current IQ2.

The voltage Vo is supplied to the base of the output transistor Q4. For this reason, the output signal Vout, as shown in FIG. 3(c), corresponds to the input signal Vin.

On the other hand, when executing the muting operation, the pulse signal Vp is set in the high level ($Vp>V1$ and $Vp>V2$).

During a period Th in which the pulse signal Vp is at the high level, the transistor Q3 is turned on and transistors Q1 and Q2 are turned off whereby there is formed a current bypass which extends from the power supply Vcc through the resistor R1, the double emitters of the transistor Q3, and the respective resistors RE1 and RE2, to the constant current circuit CS1. A current flowing through the resistor R1 is fixed to I1 regardless of the level of the input signal Vin, and the voltage drop between the two terminals provides a voltage level which can be determined by $I1\times R1$.

Therefore, the voltage level of the output voltage Vo becomes a voltage which can be determined by $Vcc-R1\times I1$.

As a result, in the output signal Vout, as shown by dotted lines in FIG. 3(c), no component of the input signal Vin occurs during the period Th of the pulse signal Vp, which means that muting has been executed. Also, the muting level of the output signal Vout becomes a d.c. voltage which can be determined by $Vcc-I1\times R1-Vbe(Q4)$. If the resistors R1 and R2 have the same resistance values ($R1=R2$) as in the above-mentioned case, then the muting level becomes a voltage level one-half the voltage level in the normal operation, that is, a middle level, so that the muting level can be fixed.

In the second embodiment, the same effects can be obtained as in the first embodiment. Also, due to the differential input structure thereof, the second embodiment can be stabilized with respect to variations of the power supply and temperatures. Further, due to the fact that the second embodiment is free from d.c. variations of the voltages V1 and V2, it is not necessary to provide any special arrangement for performing an offset adjusting operation, thereby simplifying the circuit arrangement of the process signal device.

Figure 4:
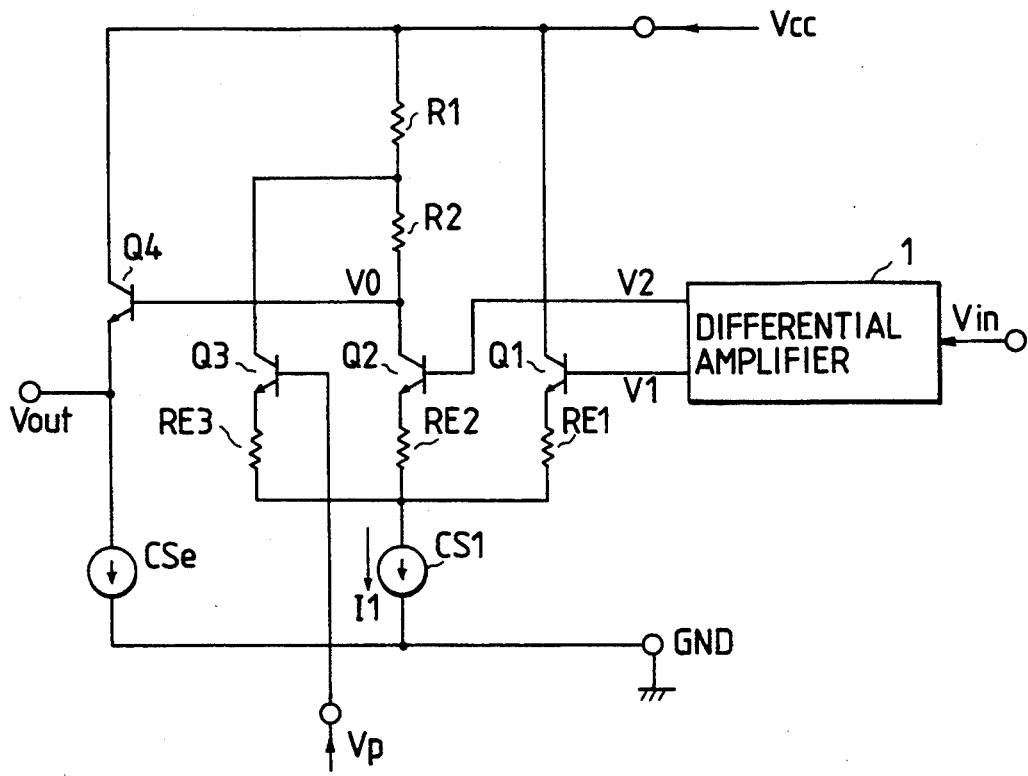
FIG. 4 is a circuit diagram of a third embodiment of a signal processing device according to the invention.

Next, a description will be given below of a third embodiment of a signal processing device according to the invention with reference to FIG. 4.

The third embodiment differs from the above second embodiment in that a transistor Q3 is constructed with a single emitter.

When performing a normal operation, the pulse signal Vp is set in the low level ($Vp<V1$ and $Vp<V2$) and the transistor Q3 is turned off. Therefore, the output voltages V1 and V2 of the differential amplifier 1 are respectively amplified by the current switch circuit 1, and an output signal Vout corresponding to an input signal Vin is obtained from the emitter of the output transistor Q4.

On the other hand, when performing a muting operation, the pulse signal is changed to the high level ($Vp>V1$ and $Vp>V2$) and the transistor Q3 is turned on. As a result of this, there is formed a current bypass which extends from the power supply Vcc through the transistor Q3 and resistor RE3 to the constant current circuit CS1, and a current I1 is allowed to flow to the resistor R1. The voltage level of the output signal Vout provides a d.c. voltage which can be determined according to $Vcc-I1\times R1-Vbe(Q4)$. In the present embodiment, the reason why the resistor RE3 is provided in the emitter of the transistor Q3 is to reduce the generation of switching noise when the pulse signal Vp is changed to the high level. However, the resistor RE3 may have a resistance value which is equal to or smaller than those of the resistors RE1 and RE2 ($RE1\geq RE3$ and $\geq RE2\geq RE3$).

Figure 5:
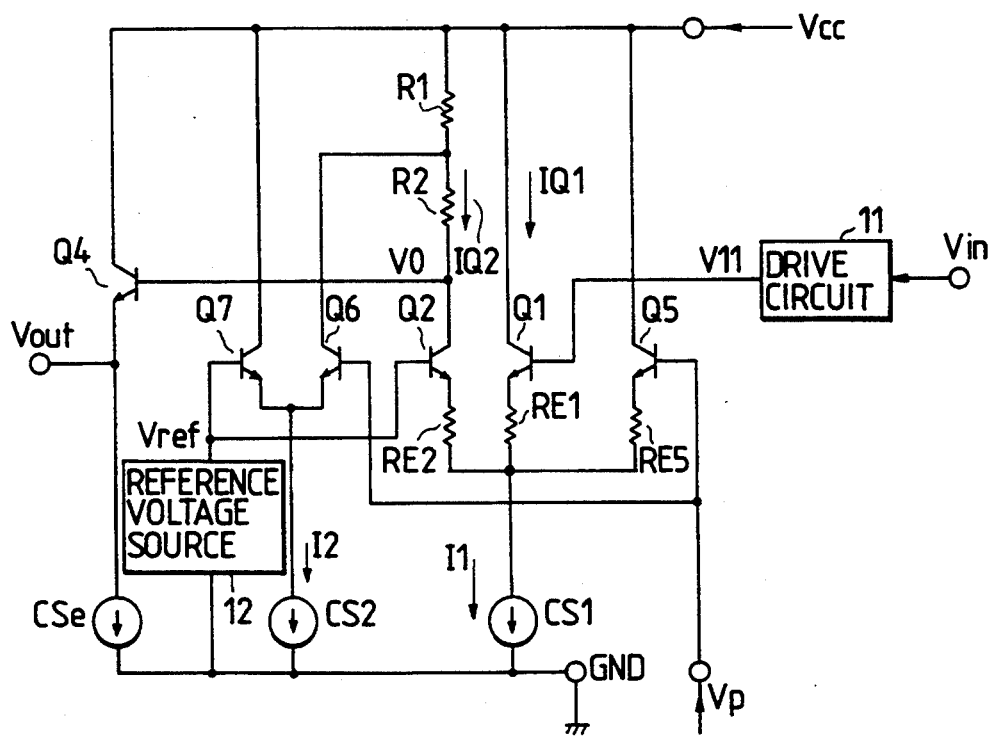
FIG. 5 is a circuit diagram of a fourth embodiment of a signal processing device according to the invention.

Next, a description will be given of a fourth embodiment of a signal processing device according to the invention with reference to FIG. 5. The fourth embodiment differs from the respective previous embodiments in that the amplifying operation in the normal operation and the muting operation are performed in accordance with a comparison with a reference voltage.

Transistors Q1, Q2 and Q5 form a current switch. The transistors Q1 and Q2 compare the output voltage V11 of a drive circuit 11, that is, a single-phase input signal, with a reference voltage $V_{ref}$ supplied from a reference power supply circuit 12 to thereby perform a switching operation. Also, the transistor Q5 compares the reference voltage $V_{ref}$ with the pulse signal Vp to thereby forcibly turn off the transistors Q1 and Q2 during muting. Transistors Q6 and Q7 compare the reference voltage $V_{ref}$ with the pulse signal Vp to thereby execute a muting operation. The current path for the transistor Q6 and constant current circuit CS3 forms a current bypass.

Next, referring to the circuit operation in the normal operation of the present embodiment, because the pulse signal Vp is set at the low level, there is obtained a relation of $V_{ref}>Vp$, and thus the transistors Q5 and Q6 are turned on. As a result of this, the transistors Q1 and Q2 perform amplifying operations by means of a voltage comparison with the reference voltage $V_{ref}$, and the current IQ2 is increased and decreased according to the level variations of the input signal Vin. The transistor Q4 also operates similarly to the above-mentioned case, and the output signal Vout corresponds to the input signal Vin.

On the other hand, for the muting operation, the pulse signal Vp is changed to the high level to thereby obtain a relation of $Vp>V11$ and $V_{ref}<Vp$. The transistor Q5 is turned on and the transistors Q1 and Q2 are forcibly turned off, thereby preventing the amplifying operations. Also, since the transistor Q6 is turned on, there is formed a current bypass which extends from the resistor through the transistor Q6 to the constant current circuit CS3, and the transistor Q7 is turned off.

The amount of current flowing through the current bypass formed by the transistor Q6 and the like is set by the constant current circuit CS3 to be equal to the current I1. Therefore, the voltage level of the output signal Vout is set to $Vcc-I1\times R1-Vbe(Q4)(I1=I2)$ so that a muting operation can be executed similarly to the above described case. In the present circuit, the drive circuit and the reference voltage source are implemented in the same circuit arrangement and a d.c. value is applied, so that influences caused by variations of the d.c. value can be reduced.

Figure 6:
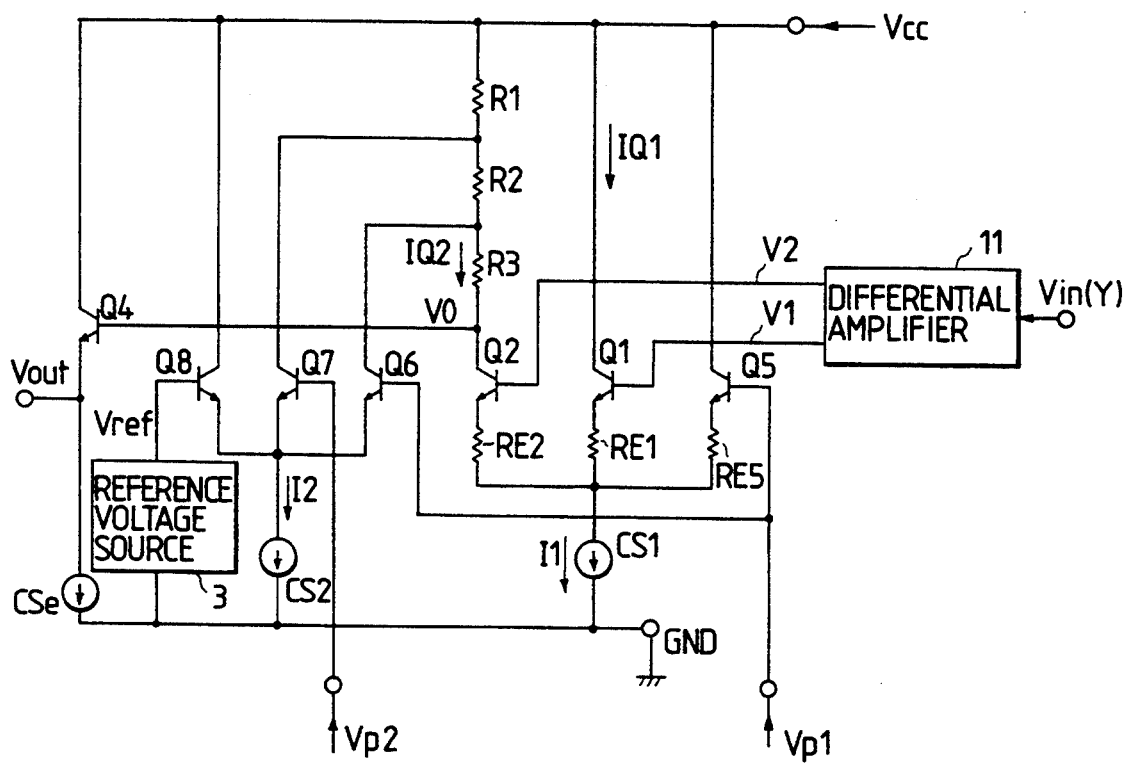
FIG. 6 is a circuit diagram of a fifth embodiment of a signal processing device according to the invention.

Next, a description will be given below of a fifth embodiment of a signal processing device according to the invention with reference to FIGS. 6 to 8. The fifth embodiment is characterized in that characters, dates and the like can be inserted in a video signal by use of the above-mentioned muting operation.

Figure 7A:
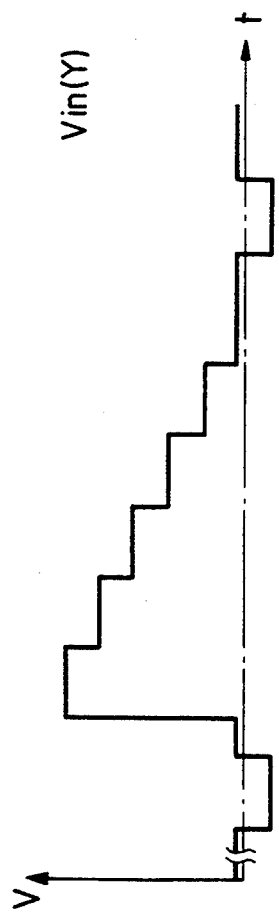
FIGS. 7(a)-7(d) are waveform charts used to explain another circuit operation according to the invention.

In the fifth embodiment, the circuit configurations and operations of the transistors Q1, Q2 and Q5 are similar to those employed in the above-described fourth embodiment. However, for the input signal Vin there is supplied a brightness signal Y as shown in FIG. 7(a). The illustrated brightness signal Y is an example of a waveform appearing during one horizontal scanning period, but accordingly the invention is not limited to the level variations shown in FIG. 7(a).

The transistors Q6–Q8, which are connected to one another in a differential manner, compare the reference voltage $V=e_z$ obtained from the reference voltage source 3 with the voltages of pulse signals Vp1 and Vp2, and form one current bypass with the transistor Q6 and another current bypass with the transistor Q7. The time widths Th of the pulse signals Vp1 and Vp2, as comparably shown in FIGS. 7(b) and (c), are set such that Vp1>Vp2, while the voltage levels of the pulse signals are set such that Vp1<Vp2.

In the normal operation, both of the pulse signals Vp1 and Vp2 are set to the low level (Vp1<V1 and Vp2<V2), the transistors Q5–Q7 are turned off, and the transistor Q8 is turned on. The output voltages V1 and V2 are respectively supplied to the respective bases of the transistors Q1 and Q2, so that similar amplifying operations to the above case can be executed. However, since the load circuit is formed by three resistors connected in series with one another, the output voltage Vo becomes a voltage determined by $Vcc - IQ2 \times (R1+R2+R3)$, and the voltage level of the output voltage vo varies according to the increase and decrease of IQ2, that is, according to the level of the brightness signal Y.

Figure 7B:
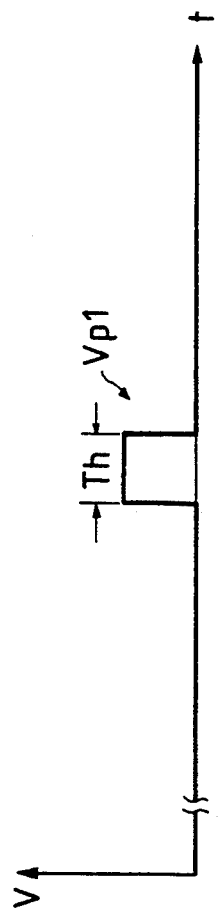

Next, referring to the insertion of character information, dates or the like as an example of signal processing, the pulse signal Vp1 is changed to the high level (at which Vp1 is larger than any of V1, V2, Vref and Vp2) while the brightness signal Y is being amplified, as shown in FIG. 7(b). As a result, the transistors Q5 is turned on and the transistors Q1 and Q2 are turned off, thereby disabling the amplifying operation. On the other hand, the transistor Q6 is also turned on and the transistors Q7 and Q8 are turned off. Also, there is formed a current path which extends from the power supply Vcc through the resistors R1 and R2 and transistor Q6 to the constant current circuit CS2. The voltage level of the output voltage Vout can be determined by $Vcc - I2 \times (R1+R2)$ $Vbe - (Q4)$. As a result, the level of part of the output signal Vout is lowered as shown by Va in FIG. 7(d).

Figure 7C:
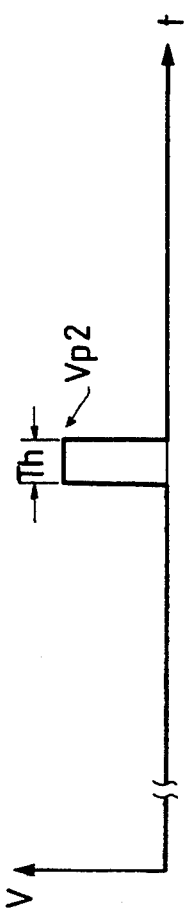

Next, if the pulse signal Vp2 is changed at a timing as shown in FIG. 7(c) to the high level (Vp2>Vp1>V1,Vp2>Vp1>V2, and Vp2>Vp1>Vref), then the transistor Q7 is turned on and the transistor Q6 is turned off. Since the pulse signal Vp1 remains at the high level, the transistor Q5 continues in the on state while the transistors Q1 and Q2 also remain on.

Because the transistor Q7 is switched on, there is formed a current bypass which extends from the power supply Vcc, through the resistor R1 and the transistor Q7 to the constant current circuit CS2, and the output signal provides a voltage level which can be determined by $Vcc - I2 \times R1 - Vbe(Q4)$. This voltage level is higher by the voltage drop of the resistor R2 than the voltage level obtained when the transistor Q6 is on. Referring to the difference between the above voltage levels with respect to the waveform of the output signal Vout, there is obtained a high level as shown by Vb in FIG. 7(d).

As clearly shown in FIGS. 7(b) and 7(c), the time width of the pulse signal Vp2 is smaller than the time width of the pulse signal Vp1. While the pulse signal Vp1 is at the high level, if the pulse signal Vp2 is changed to the low level, then the transistor Q7 is turned off and the transistor Q6 is turned on again. Therefore, the output signal Vout is changed from the voltage level shown as Vb to the voltage level. illustrated as Va.

Figure 7D:
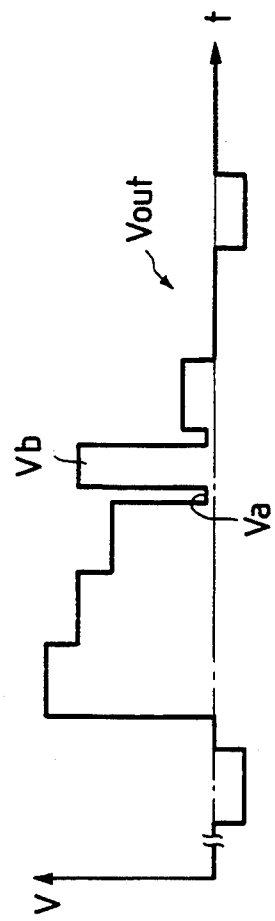

After then, if the pulse signal Vp1 is changed to the low level, then the above transistors are turned off, thereby enabling the transistors Q1 and Q2 to perform their normal operations. Also, the transistor Q8 is turned on and no current bypass is formed. Therefore, the output signal Vout provides an output signal into which a d.c. level independent of the level of the brightness signal Y during a horizontal scan period is inserted at a desired position of the brightness signal Y, as shown in FIG. 7(d).

Next, a description will be given below of an image to be projected by means of the output signal Vout.

Figure 8:
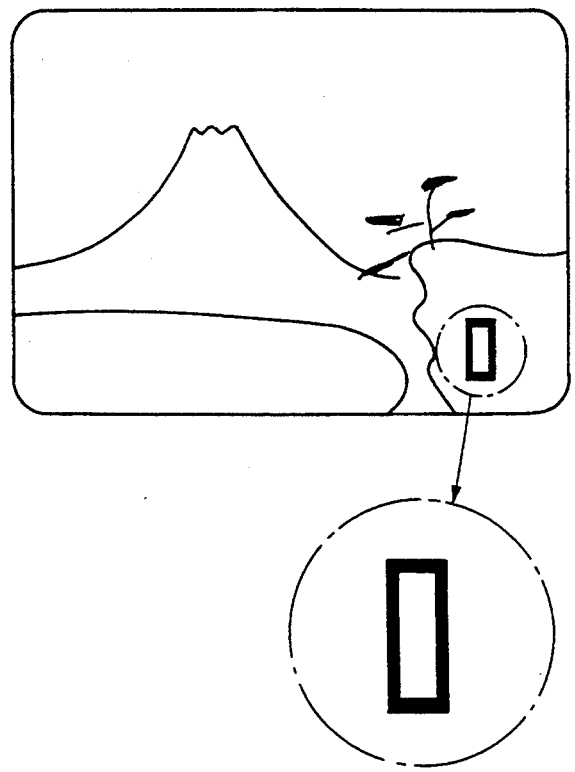
FIG. 8 is a view of an example of a display image which illustrates an embodiment of a muting, circuit according to the invention.

It is assumed that an image as shown in FIG. 8 is displayed by means of the brightness signal Y corresponding to one frame. When a date or the like is to be inserted at a desired position of the image, for example, at the right bottom portion thereof, as described in connection with FIGS. 7(a)–7(d), the levels of the pulse signals Vp1 and Vp2 are processed while the corresponding brightening signal is being scanned. As a result, as shown in an enlarged manner in FIG. 8, a high brightness portion due to the pulse signal Vp2 appears in a low brightness portion due to the pulse signal Vp1. For this reason, by controlling the time widths and timings of the pulse signals Vp1 and Vp2, characters, symbols and the like can be displayed by use of the difference between the brightness. Also, a difference between the brightness of the pulse signals Vp1 and Vp2 can be set at a desired difference regardless of the brightness of an image serving as background, and thus the high brightness portion can be rimmed with the low brightness portion, so that the high brightness portion can be seen very clearly.

Figure 9:
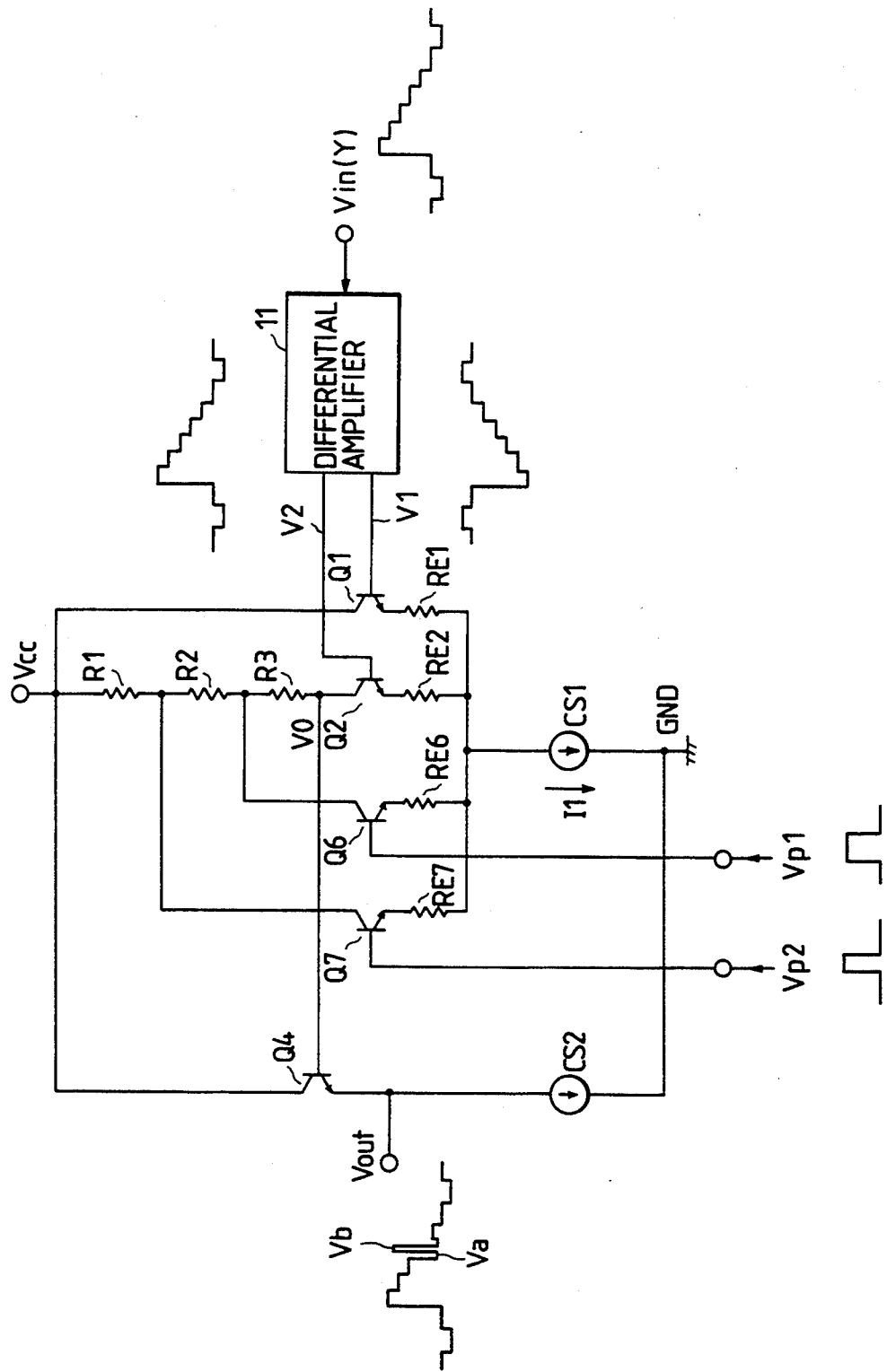
FIG. 9 is a circuit diagram of a sixth embodiment of a signal processing device according to the invention.

Next, a description will be given below of a sixth embodiment of a signal processing device according to the present invention with reference to FIG. 9.

The sixth embodiment, which employs a circuit which is a further simplified version of the circuit already discussed in connection with FIG. 6, eliminates a current supply source in order to reduce the number of elements and to reduce the amount of power consumption, and can be operated by the current supply source CS1. In other words, the load resistor is composed of three resistors R1–R3 and a switch circuit for a differential input pulse and a data input pulse representing the date is produced by transistors Q1, Q2, Q6 and Q7.

Referring to the operation of the circuit employed in the sixth embodiment, when the pulse signals Vp1 and Vp2 are both at the low level (that is, when the date data is not fed), the base potentials of the transistors Q6 and Q7 are lower than the base potentials of the transistors Q1 and Q2, whereby the transistors Q6 and Q7 are turned off and the current I1 of the constant current source CS1 is shunted to the transistors Q1 and Q2. In other words, the output voltage Vo in a current switch circuit formed by the transistors Q1 and Q2 is obtained not only in the form of a current flowing to the transistor Q2 but also in the form of the voltage drops of the three resistors R1, R2 and R3, and the output signal Vout is allowed to be equal to or two or more times the input signal Vin.

Next, a case in which date information is fed into a brightness signal will be considered. When the pulse signal Vp1 is changed to the highest level, then the base of the transistor Q6 provides the highest potential as well. At that time, the transistor Q6 is turned on and the output signal Vut, as shown by the signal Va in FIG. 7(d), is changed to a level of $Vcc-(R1+R2)\times I1 - Vbe(Q4)$, that is, a level which is higher by $5\times IRE$ than a pedestal level. Further, if the pulse signal Vp2 is changed to the high level and the high level of the pulse signal Vp2 is made higher than the high level of the pulse signal Vp1, then the transistor Q6 is cut off and the transistor Q7 is turned on. At that time, the output signal Vout, as shownby the signal Vb in FIG. 7(d), is changed to a level of $Vcc-R1\times I1-Vbe(Q4)$, that is, a level which is higher by $80\times IRE$ than the pedestal level.

As a result, as has been described in connection with FIG. 8, a character or the like which is suitably fringed can be inserted into an image being displayed.

In the present embodiment, the current switch circuit is arranged in such a manner that relations of $RE1=RE2\geq RE6$ and $RE1=RE2\geq RE7$ and maintained, and the resistors RE6 and RE7 are provided to Preventswitching noise from appearing in the output.

It should be mentioned at this point that, in view of the fact that currently available video apparatus can perform various kinds of functions, the differential amplifier 1 described hereinbefore can be used not only to supply the output voltage of forward or reverse phase but also for other purposes.

As has been described hereinbefore according to the signal processing device of the invention there are provided a current which circuit which can provide an output signal correspond to an outputt signal and a current bypass forming circuit which, responsive to a pulse signal, forms a current bypass with respect to the current switch circuit, whereby an output signal corresponding to the input signal can be cut off then the current bypass is formed and it is possible to obtain an output signal having a given level based on a current flowing through the current bypass.

Also, according to the invention, the above-mentioned current bypass forming circuit can be used to form a plurality of current bypasses selectively, so that the level of the output signal can be set to a desired level.

According to the signal processing device of the invention constructed in the above-mentioned manner, the transmission of the input signal can be shut off temporarily to thereby set the input signal to a desired d.c. level, and the shut-off time and the setting level can be adjusted easily in accordance with the time width and level of the pulse signal.

Therefore, when the semiconductor integrated circuits are produced, there is eliminated the need for providing the externally mounted parts which have been conventionally used for voltage adjustment, with the result that it is possible to simplify the structure of the apparatus in which the present signal processing device is applied and the use of the apparatus is facilitated.

Figure 10:
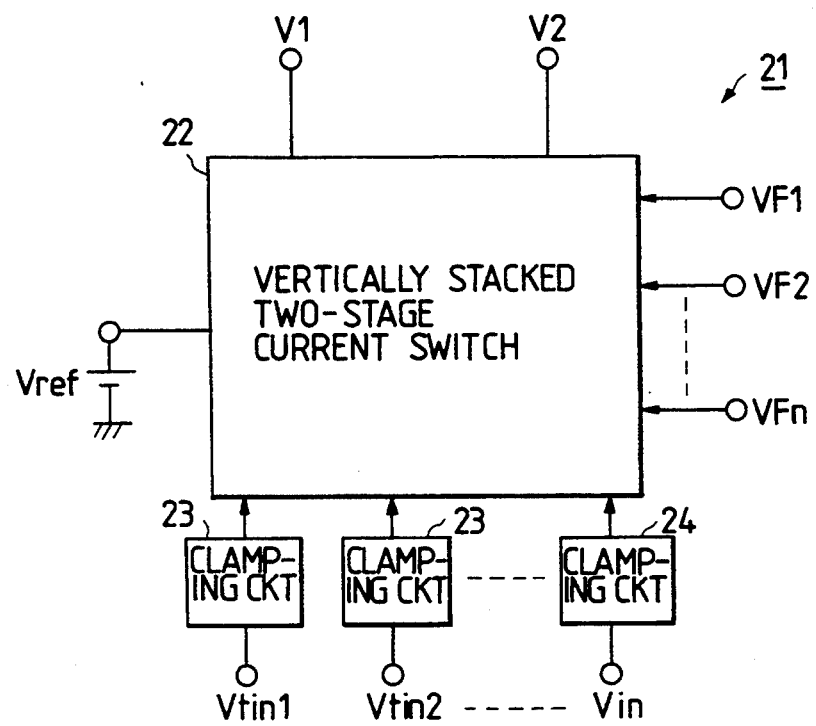
FIG. 10 shows a basic block diagram of a seventh embodiment of the invention.
Figure 11:
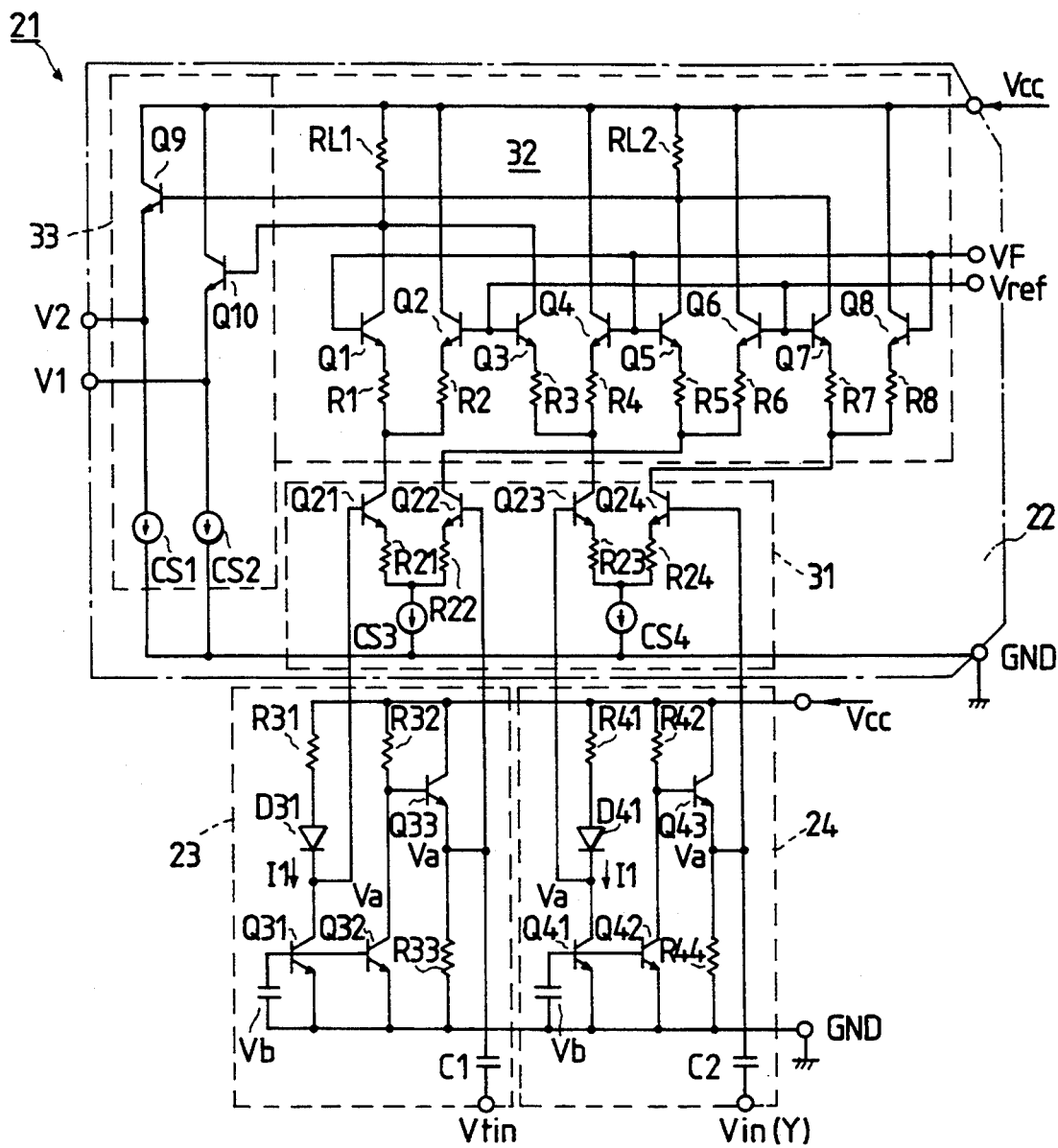
FIG. 11 is a circuit diagram of a basic structure of the seventh embodiment of the invention.
Figure 14:
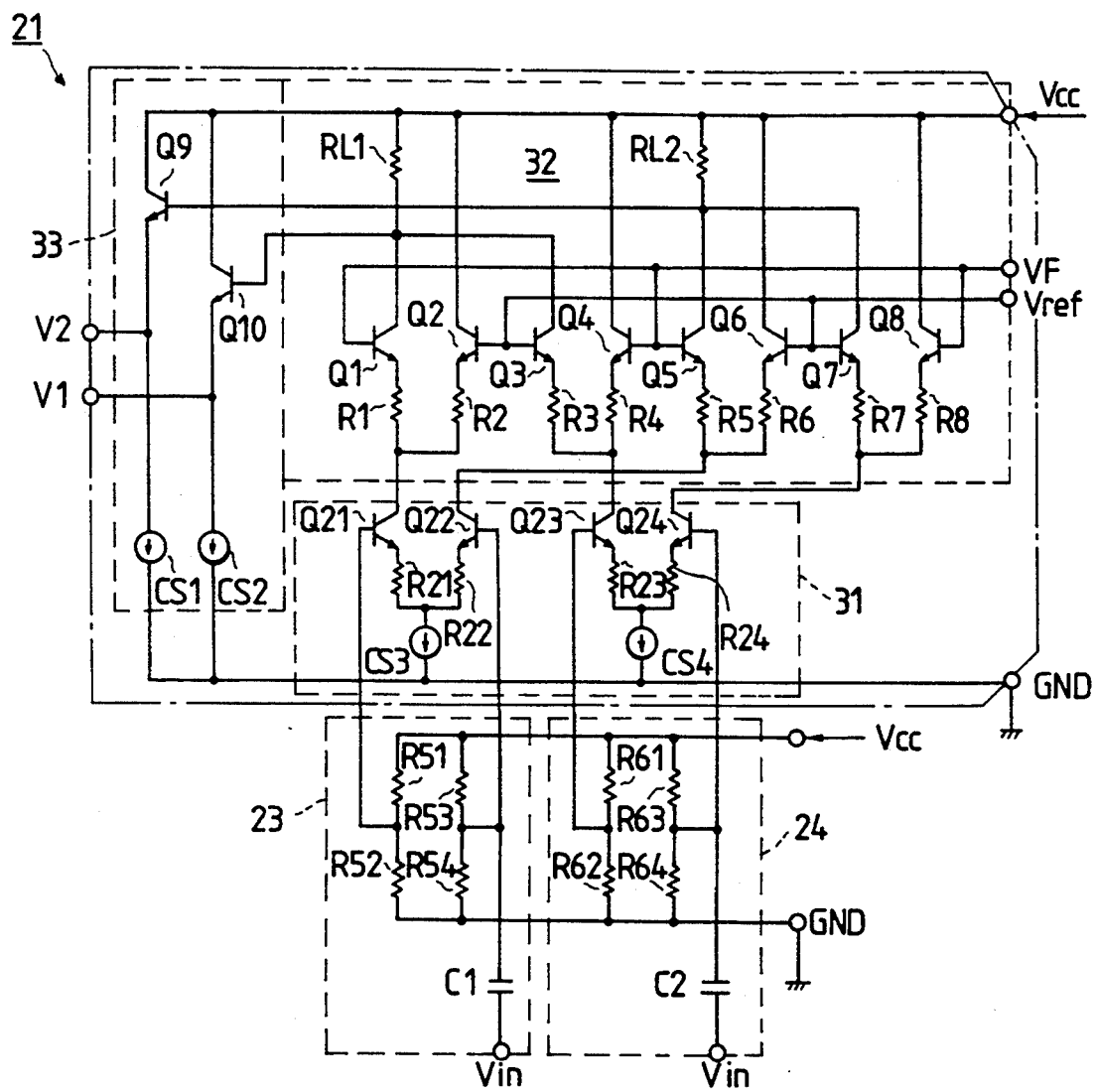
FIG. 14 is a circuit diagram of an eighth embodiment of a signal processing device of the invention.

A description will now be given of a seventh embodiment of a signal processing device according to the invention with reference to FIGS. 10 to 11. In FIG. 10, there is shown a circuit diagram of the seventh embodiment of the present signal processing device, which illustrates the basic circuit arrangement. In FIG. 11, there is shown a specific circuit diagram. In FIGS. 12 (a)–12 (d) and 13, there are shown waveform charts which are respectively used to explain the circuit operation of the seventh embodiment.

The basic structure of the signal processing device 21 consists mainly of a vertically stacked two-stage current switch circuit 22 (which will hereinafter be referred to simply as a current switch circuit), a plurality of clamping circuits 23 for a title signal Vtin, and a clamping circuit 24 for an input signal Vin such as a brightness signal, a color signal or the like. In FIG. 11, only one clamping circuit 23 is shown for purposes of illustration.

A switching circuit 31, which forms the current switch circuit 22, corresponds to a first current switch circuit according to the present invention and, in the present embodiment, consists of two sets of switch circuits. A switch circuit 32 corresponds to a second current switch circuit according to the present invention and serves as current switch which combines (mixes) an input signal Vin to be discussed later (in the present embodiment, a brightness signal Y) with a title signal Vtin. The switch circuit 32, in the present embodiment, is composed of four sets of switch circuits. Reference numeral 33 designates an output circuit. Resistors RL1 and RL2 are the load resistors of the second switch circuit 32.

Each of the clamping circuits is used to generate a constant voltage Va and supply it to the first switch circuit 31 and to supply to the first switch circuit the title signal Vtin superimposed on the constant voltage Va when the title signal is supplied. With respect to the generation of the constant voltage Va, two constant current circuits are formed from a stabilized bias power supply Vb and transistors Q31 and Q32. For this reason, a constant current I1 flows to a diode D31 which operates as a level shifter. As a result, there can be obtained a stabilized constant voltage Va determined by $Vcc-(I1\times R31)-VF(D31)$.

On the other hand, the constant current I1 flows to a current path for the resistor R32 and transistor Q32 as well, and a voltage determined by $Vcc-(I1\times R32)-Vbe(Q33)$ appears at the emitter of a transistor Q33, that is, at one end of an emitter resistor R33. If the resistance values of the resistors R31 and R32 are set to be equal to each other and the forward voltage VF of the diode D is equal to the baseemitter voltage Vbe(Q33) of the transistor Q33, then the emitter voltage will coincides which the voltage Va. In an IC, the diode and transistor are formed in the same device process and, therefore,- the above mentioned VF and Vbe can be matched to each other with ease, so that the voltage Va can be set at the same voltage level. For this reason, when a title signal Vtin as shown in FIG. 12(b) is supplied, then a pedestal level is set to the voltage Va.

The clamping circuit 24 is used to generates the constant voltage Va and supply it to the first switch circuit 31, and at the same time is used to superimpose an input signal Vin, that is, a brightness signal Y in the present embodiment, on the constant voltage Va and supply the superimposed signal to the first switch circuit 31. The clamping circuit 24 similarly consists mainly of a constant current circuit formed of a bias voltage Vb and transistors Q41 and Q42, a resistor R41 and a diode D41 which cooperate to perform current-voltage conversion, and a resistor R42, a transistor Q42 and an emitter resistor R44 which cooperate to generate the constant voltage Va at the emitter of the transistor Q43. Capacitors C1 and C2, which are respectively provided in the clamping circuits 3 and 4, respectively used to block any d.c. offset in the input signal. In accordance with the invention, only these two capacitors need be provided as externally mounted parts when the inventive signal processing device is constructed as an integrated circuit.

Next, a description will be given below of the circuit operation of the signal processing device of the seventh embodiment of the invention. The circuit operation varies in the following manner according to a level difference between a reference voltage Vref supplied to second switch circuit 32 and a fade signal VF. The fade signal VF corresponds to a control signal according to the present invention.

a) When VF<Vref:

If a brightness signal Y shown in FIG. 12(a), as an input signal Vin, is supplied through a capacitor C2 to the clamping circuit 24, then the brightness signal Y is superimposed on the voltage Va and then applied to the base of the transistor Q24 forming the switch circuit 31. Although the voltage Va is applied to the base of the transistor Q23, the above-mentioned application of the input signal Vin causes a current flowing through the transistor Q24 to increase and a current flowing through the transistor Q23 to decrease. As a result, in the second switch circuit 32, there is formed a current switch path composed of transistors Q7 and Q8.

Although the reference voltage Vref is supplied to the base of the transistor Q7 and the fade signal VFis supplied to the transistor Q8, they are respectively set to the above-mentioned levels so that a current flowing through the resistor RL2 and transistor Q7 is increased. As a result, the voltage drop of the resistor RL2 is increased according to the input signal Vin. Therefore, there can be obtained an output signal V2 having a reverse phase at the emitter of the transistor Q9 which forms an output circuit 33.

On the other hand, with respect to the current path which is formed by a transistor Q23, because Vref>VF, the current flowing through the resistor RL1 and the transistor Q3 is increased with respect to a current flowing through the transistor Q4. However, since the current is reduced due to the operation of the transistor Q23, the voltage drop across the resistor RL1 is decreased. For this reason, there can be obtained an output signal V1 having a forward phase at the emitter of a transistor Q20 which forms the output circuit 33.

In this state, when the title signal Vtin is supplied, then the title signal Vtin will be superimposed on the voltage Va and then applied to the base of the transistor Q22 which forms the first switch circuit 31. In spite of the fact that the voltage Va is applied to the base of the transistor Q21, the base voltage of the transistor Q22 will be at the high level. The current flowing through the transistor Q22 is increased, while the current flowing through the transistor Q21 is decreased. Although there is provided between the output terminal (the collector of the transistor Q22) and the power supply Vcc a current switch formed by the transistors Q5 and Q6, because Vref>VF, the current flowing through the transistor Q6 is increased. Since the collector of the transistor Q6 is not connected to the resistor RL2, the title signal Vtin has no influence on the output signal V2 having a reverse phase.

On the other hand, in the current path formed by the transistor Q21, there is provided a current switch which is composed of the transistors Q1 and Q2. Due to the fact that Vref>VF, the current flowing through the transistor Q2 is increased. Since the collector of the transistor Q2 is not connected to the resistor RL1, the title signal Vtin has no influence on the output signal V1 having a forward phase.

In other words, when Vref>VF is established, there are obtained output signals V1 and V2 which correspond to the input signal Vin but which have opposite phases.

b) When VF>Vref:

While the input signal Vin is being processed in the above-described manner, the title signal Vtin is supplied as shown in FIG. 12(b), and also VF>Vref is set with respect to a desired time at as shown in FIG. 12(c). Although the transistor Q24 is driven in accordance with the input signal similarly to the above-mentioned case, with respect to the transistors Q7 and Q8 provided in the collector circuit, the current flowing through the transistor Q8 is increased. In other words, the transistor Q7 is switched over to the transistor Q8. For this reason, a current corresponding to the title signal Vtin will not flow in the resistor RL2 and no component of the input signal Vin will appear in the output signal V2 having a reverse phase.

With respect to the title signal Vtin, the current flowing through the transistor Q22 is increased and, with respect to the transistors Q5 and Q6 provided in the collector circuit, the amount of a current flowing through the transistor Q5 is increased. In other words, the transistor Q6 is switched over to the transistor Q5. For this reason, the amount of the current flowing through the resistor RL2 is made to correspond to the title signal Vtin, and the output signal V2 having a reverse phase also corresponds to the title signal Vtin.

On the other hand, in the current path for the transistor Q23, the transistor Q3 is switched over to the transistor Q4. Also, in the current path for the transistor Q21, the transistor Q2 is switch over to the transistor Q1. Therefore, the current flowing through the resister RL1 and the voltage level are lowered and the output signal V1 having a forward phase corresponds to the title signal Vtin.

In other words, when Vtin>Vref, there are obtained output signals V1 and V2 which correspond to the title signal Vtin and which have opposite phases.

c) When the relation is returned from b) to a):

Since the above operation is performed with respect to the desired time at, a component of the title signal Vtin appears in the output signal V1 (which is shown as an output signal having a forward phase), as shown in FIG. 12(d). If the relation is reset again from this state to Vref>Vf, then such circuit operation as described above in a) is executed to thereby obtain the output signal V1 corresponding to the input signal, as shown for the times following the desired time at.

To the respective emitters of the transistors Q1-Q8 forming the second current switch 22 there are connected the respective resistors R1-R8. As shown on an enlarged scale in FIG. 13, when the fade signal VF is slowly changed from the low level to the high level and from the high level to the low level and the resistance values of the respective resistors R1-R8 are set to large values, the MIX time before and after crossing the reference voltage Vref is extended; in other words, the time during which the brightness signal Y and the title signal Vtin appear in the output signal V1 and V2 is extended. For this reason, the time for mixing the two images depends on the resistance values of the resistors R1–R8, with the mixing time being extended as the resistance values are made larger.

As discussed above, according to the signal processing device of the present embodiment, there are obtained output signals which correspond to a plurality of respective input signals and which have opposite phases with respect to one another, and the length of the time necessary for mixing a plurality of input signals can be extended. Also, due to the fact that the first and second current switch circuits are respectively formed of a pair of transistors which are connected to each other in a differential manner, the present signal processing device is substantially free from influences caused by power variations, temperature variations and the like, and is able to perform signal processing in a stable manner.

Further, due to the fact that the pedestal levels are set for both the input signal Vin and the title signal Vtin, the reference levels of the output signals V1 and V2 will not fluctuate. (This is important when performing such signal processing with respect to the output signals V1 and V2 as will be discussed below with respect to a specific application of the device of the invention.) That is, the setting of the pedestal levels allows the following signal processing operations to be executed in a stable manner.

In order to perform the fading operation quickly, the resistors R1–R8 may be omitted or switched out of circuit.

Next, a description will be given below of an eighth embodiment of a signal processing device according to the invention with reference to FIG. 14 and 15(a)–15(d). The eighth embodiment differs from the above-described seventh embodiment in that the structures of the clamping circuits 23 and 24 are simplified and a color signal is supplied as the input signal Vin.

The structure and operation of the current switch circuit 22 in the eighth embodiment are similar to those of the current switch circuit 22 in the seventh embodiment. The clamping circuit 23 includes voltage dividing resistors R51 and R52 connected in series with each other between the power supply voltage Vcc and ground for generating the voltage Va. Also, the voltage Va for setting the pedestal level of the title signal Vtin can be obtained by means of resistors R51 and R54 connected in series with each other between the power supply Vcc and ground.

The clamping circuit 24 includes voltage dividing resistors R61 and R62 connected in series with each other between the power supply Vcc and ground so as to generate the voltage Va. The voltage Va for setting the pedestal level of a color signal C supplied as the input signal Vin can also be obtained by means of resistor R63 and R64 connected in series between the power supply Vcc and ground. The input signal Vin may be the above-mentioned brightness signal Y but, in the eighth embodiment, the color signal C is used as the input signal Vin, and thus the signal processing operation with the color signal will be described.

A more specific description will now be given of the circuit operation of the eighth embodiment of the invention.

a) When Vref>VF:

In this case, a circuit operation similar to a) in the seventh embodiment is executed. That is, due to the fact that the voltage Va is supplied from the clamping circuit 23 to transistors Q21 and Q22 forming the first switch 31, there is obtained a balanced state. On the other hand, while the voltage Va is supplied from the clamping circuit 24 to a transistor Q23 as well, to a transistor Q24 there is supplied a color signal C shown in FIG. 15(a) after the color signal C is superimposed on the voltage Va. As a result, the amount of current flowing through the transistor Q24 is increased while the amount of a current flowing through the transistor Q23 is decreased.

Figure 15A:
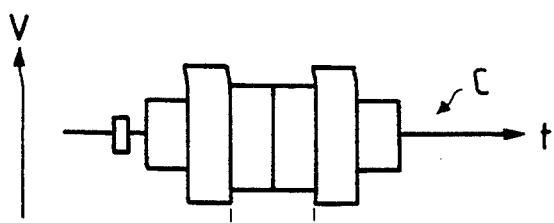
FIGS. 15 (a)-15(d) constitute a waveform chart of the circuit operation of the eighth embodiment.
Figure 15B:
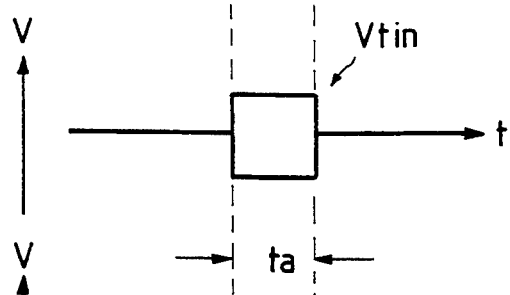
Figure 15C:
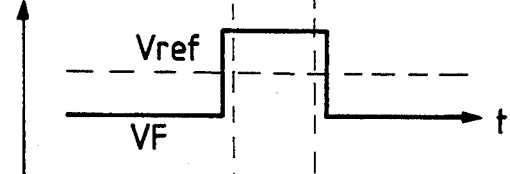
Figure 15D:
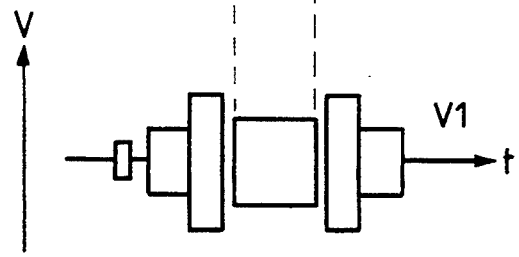

The operation of the second switch circuit 32 is also performed similarly to the above-mentioned case, so that there can be obtained output signals V1 and V2 which both correspond to the color signal C but which have opposite phases with respect to one another; that is, one output signal has a forward phase while the other has a reverse phase.

b) When Vref<VF:

If a title signal Vin as shown in FIG. 15(b) is supplied, then the amount of current flowing through the transistor Q22 is increased while the amount of current flowing through the transistor Q21 is decreased. Therefore, there is formed a current path for the transistors Q5 and Q6. As shown in FIG. 15(c), because Vref>VF, the second switch circuit 32 then performs a circuit operation similar to the above-mentioned case. As a result, as shown in FIG. 15(d), a component of the title Vtin appears in the output signals V1 and V2 during the time at.

In the signal processing device of the present embodiment as well, similar effects to the above-mentioned seventh embodiment can be obtained.

Figure 16:
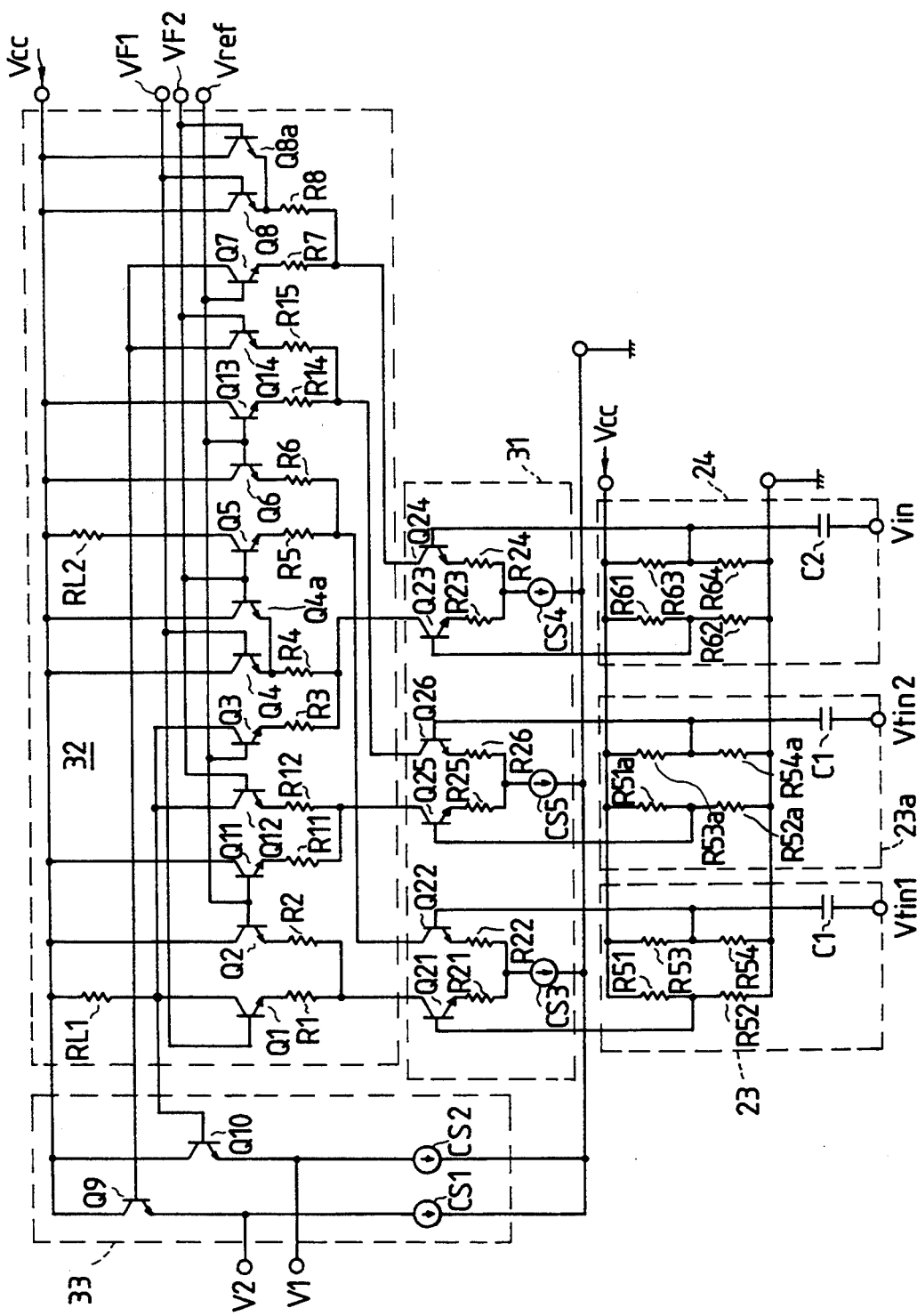
FIG. 16 is a circuit diagram of a ninth embodiment of a signal processing device according to the invention.

Next, a description will be given below of a ninth embodiment of a signal processing device according to the invention with reference to FIG. 16. The ninth embodiment is characterized in that a plurality of title signals Vtin can be input.

Referring at first to the differences between the present embodiment and the immediately previously described embodiments, there is added a clamping circuit 23a which is used to input a title signal Vtin1 and, in the first switch circuit 31, there is added a switch circuit which is made up of transistors Q25 and Q26, resistors R25, R26 and a constant current circuit CS5.

Also, in the second circuit 32, there is added a switch circuit which is made up of the collector of the transistor Q25, transistors Q11 and Q12, and resistors R11 and R12 and, to the collector of the transistor Q26, there is added a switch circuit which is made up of transistors Q13 and Q14, and resistors R13 and R14.

Further, a transistor Q4a is added to the collector of the transistor Q23 which provides a signal processing path for the input signal Vin, and a transistor QSa is added to the collector of the transistor Q24. The input signal Vin may be either the brightness signal Y or the color signal C. Also, the second switch circuit 12 is arranged such that its switching operation can be performed by comparing the reference voltage Vref with the first and second fade signals VF1 and VF2.

The signal processing device constructed in the above-described manner operates in the manner indicated in the following Truth Table 1:

TABLE 1

| Mode | Truth | | |
|------|-----|-----|--------|
|      | VF1 | VF2 | V1 (V2) |
| (1)  | L   | L   | Vin    |
| (2)  | H   | L   | Vtin1  |

TABLE 1-continued

| Mode | Truth VF1 | VF2 | V1 (V2) |
|---|---|---|---|
| (3) | L | H | Vtin2 |

In particular, it can be understood from mode (1) that, when the fade signals VF1 and VF2 are both at the low level L with respect to the reference voltage Vref, there then can be obtained an output signal V1 which corresponds to the input signal V1. In this case, in the first switch circuit, the switch circuit, which is formed of the transistors Q23 and Q24, is operated responsive to the input signal V1, and the switch circuit arranged so as to correspond to the title signals Vtin1 and Vtin2 is in a balanced state, similarly as in the above-mentioned case.

As for the switch circuit provided in the collector of the transistor Q23, the reference voltage Vref is supplied to the base of the transistor Q3 and the fade signals VF1 and VF2 are supplied to the bases of the transistors Q4 and Q4a, respectively. For this reason, in mode (1), the amount of current flowing through the transistor Q3 is increased and decreased according to the input signal Vin.

On the other hand, as for the switch circuit provided in the collector of the transistor Q24, the reference voltage Vref is supplied to the base of the transistor Q7 and the fade signals VF1 and VF2 are supplied to the bases of the transistors Q8 and Q8a, respectively. For this reason, in mode (1), the amount of current flowing through the transistor Q7 increases and decreases according to the input signal Vin.

Further, due to the actions of the resistor RL1 and transistor Q10 which are respectively arranged to correspond to the increase and decrease of the current of the transistor Q3, there is obtained an output signal V1 having a forward phase. Also, due to the actions of the resistor RL2 and transistor Q9 respectively arranged so as to correspond to the current increase and decrease of the transistor Q7, there can be obtained an output signal V2 having a reverse phase.

In operation mode (2), when the fade signal VF1 is changed to the high level H, then there is formed a current path for the resistor RL1 and transistors Q1 and Q21 and, due to the voltage drop of the resistor RL1, there is obtained from the transistor Q10 an output signal v1 having a forward phase and corresponding to the title signal Vtin1. Also, there is formed a current path for the resistor RL2 and transistors Q5 and Q22 and, due to the voltage drop of the resistor RL2, there is obtained from the transistor Q9 an output signal V2 having a reverse phase and corresponding to the title signal Vtin2.

In operation mode (3), when the fade signal VF2 is changed to the high level, then there is formed a current path for the resistor RL1 and transistors Q12 and Q25, and there is obtained from the transistor Q10 an output signal V1 having a forward phase and corresponding to the title signal Vtin2. Also, there is formed a current path for the resistor RL2 and transistors Q14 and Q26, and there is obtained from the transistor Q9 an output signal V2 having a reverse phase and corresponding to the title signal Vtin2.

There, special attention must be paid to the operations of the above-mentioned transistors Q4a and Q8a. That is, in operation modes (2) and (3), while the fade signals VF1 and VF2 are both at the high level, the signal component of the input signal Vin must be shut off. Specifically, when the fade signal VF1 is changed to the high level, similarly as in the previously described embodiments, the transistors Q4 and Q8 are turned on to thereby shut off the signal component of the input signal Vin. However, according to the previous embodiments, the above-mentioned shut off cannot be realized when the fade signal VF2 is changed to the high level.

In view of the above fact, according to the present embodiment, there are provided the transistors Q4a and QSa that can be turned on when the fade signal VF2 is changed to the high level H. According to this structure, when Vref<VF2 is established, the transistors Q4a and Q8a are turned on and no current path is formed for the resistors RL1 and RL2. For this reason, the signal component of the input signal Vin is not transmitted and the output signals V1 and V2 are allowed to correspond to the title signal Vtin2.

Figure 17:
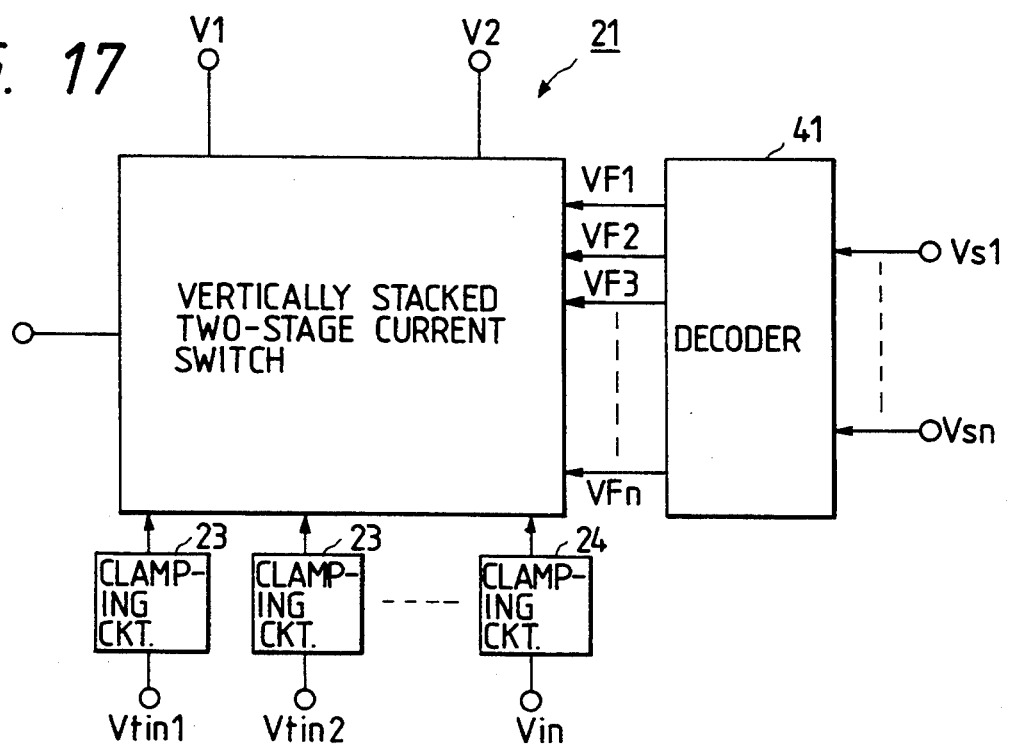
FIG. 17 is a circuit diagram of a tenth embodiment of a signal processing device according to the invention.

Next, a description will be given of a tenth embodiment of a signal processing device according to the invention with reference to FIGS. 17-19. The tenth embodiment, as shown in FIG. 17, is characterized in that there is added a decoder 41 which is used to switch among fade signals VF1-VFn.

In the tenth embodiment, the vertically stacked two-stage current switch circuit 22 and clamping circuits 23 and 24 may have the same structures as employed in the previously described embodiments, and hence a further detailed description of those elements will be omitted. A description will be given below of an embodiment of the decoder 41.

Figures 18, 19:
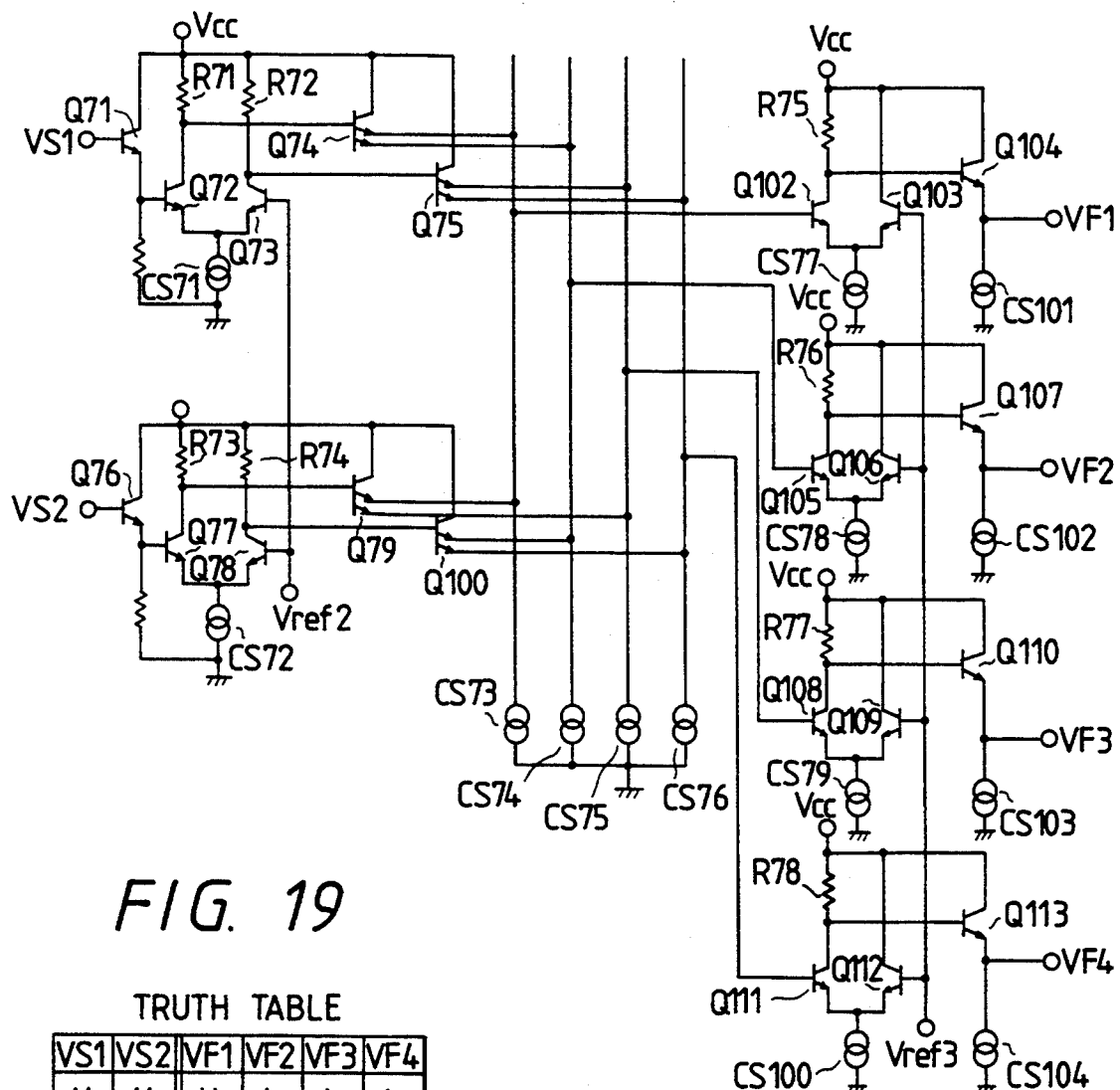
FIG. 18 is a circuit diagram of a decoder employed in the invention.
FIG. 19 shows a truth table relating to the operation of the circuit of FIG. 18.

In FIG. 18, Q71-Q77 and Q100-Q113 designate transistors, and CS71-CS79 and CS100-CS104 indicate current sources. In FIG. 18, when VS1 and VS2 are both at high levels, only the signal VF1 goes to the high level, while the other signals VF2-VF4 go to the low level. Also, in other combinations of the signals VS1 and VS2 as well, similarly, only one of the signals VF1-VF4 is allowed to go to the high level.

FIG. 19 shows the truth table for the operation of the circuit of FIG. 18.

Figure 2:
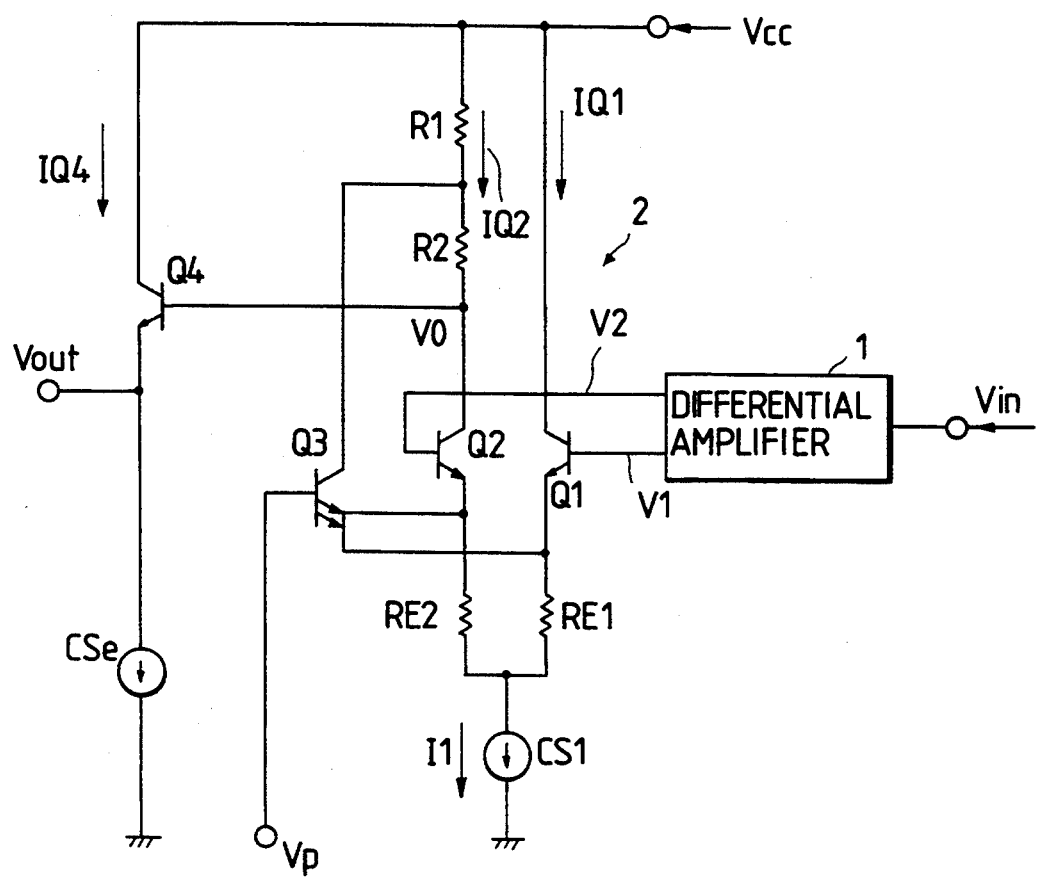
FIG. 2 is a circuit diagram of a second embodiment of a signal processing device according to the invention.

It is to be noted that the above embodiments of the signal processing device of the invention can be employed to supply the signals V1 and V2, for instance, in the circuit of the above-described FIG. 2.

A description has been given hereinbefore of several embodiments of the present invention. However, the present invention is not limited to these embodiments but various modifications are also possible.

For example, in the above-mentioned embodiments, the signal processing device is composed of bipolar transistors but it may be formed of MOS transistors or may be formed as an IC which is a mixture of MOS and bipolar transistors.

As has been described hereinbefore, according to the signal processing device of the invention, a reference level for a plurality of input signals can be set, it is possible to obtain output signals having opposite phases with respect to one another and corresponding to a one of the input signals for which the reference level has been set, it is possible to obtain an output signal which is a combination (mixture) of other signals than the above input signal by comparing a reference voltage with a control signal, and it is possible to set a time for the signal combination with ease.

Therefore, it is possible to obtain an output signal corresponding to one of the input signals and an output signal which is a mixture of input signals other than the above input signal in such a manner that the two output signals have opposite phases with respect to one another, that is, one of the output signals has a forward phase and the other has a reverse phase. This can eliminate the need for provision of a phase inverter circuit or the like for the output signals, and also can simplify the structure of a circuit which is used to process the desired output signals.

Also, due to the fact that the above-mentioned output signals can be obtained with the levels thereof properly set, the signal processing operations can be performed in a stable manner.

Further, due to the fact that the time necessary to mix one of the input signals with the other input signals can be set easily, if the input signal is an image signal, then when an image is mixed with another image, the mixing time can be extended so that the image processing can be formed in various manners.

What is claimed is:

1. A signal processing device comprising:
   a differential amplifier comprising first and second transistors connected in respective first and second current paths, and a first constant current source connected to said first and second transistors;
   a source of a pair of input signals, the input signals being applied to said first and second transistors, respectively;
   a load circuit connected in said second current path; and
   a current bypass circuit for bypassing current from said second current path, and having a switch for selectively coupling said current bypass circuit to said second current path, wherein said load circuit comprises a pair of resistors having equal resistance values and being connected in series with one another in said second current path, wherein said current bypass circuit is connected to a connection point between said resistors, and an output terminal of said signal processing device is connected to a connection point between one of said resistors and said second transistor.

2. The signal processing device of claim 1, wherein said current bypass circuit comprises a second constant current source and a transistor switch connected in series with said second constant current source.

3. The signal processing device of claim 1, wherein said switch of said current bypass circuit comprises a transistor switch connected between said second current path and said first constant current source.

4. The signal processing device of claim 3, further comprising an output transistor and a second constant current source connected in an emitter follower circuit, a base of said output transistor being connected to said load circuit, and an output terminal of said signal processing device being connected to an emitter of said output transistor.

5. The signal processing device of claim 3, wherein said transistor switch comprises a double-emitter transistor having a collector connected to said load circuit and a pair of emitters connected to emitters of respective ones of said first and second transistors.

6. The signal processing device of claim 3, wherein said transistor switch comprises a transistor having a collector connected to said load circuit and an emitter connected to said first current source.

7. The signal processing device of claim 1, wherein said input signals comprise a pair of signals varying in level 180° out of phase with respect to one another.

8. The signal processing device of claim 1, wherein said input signals comprise a reference voltage and a single-phase input signal.

9. The signal processing device of claim 8, wherein said reference voltage is applied to a base of said second transistor, and said single-phase input signal is applied to a base of said first transistor.

10. The signal processing circuit of claim 1, wherein said bypass circuit further comprises: a second differential amplifier comprising third and fourth transistors and a third constant current source connected to said third and fourth transistors; a reference voltage source connected to bases of said second and third transistors; and a fifth transistor connected in parallel to said first transistor, wherein a control signal is applied to bases of said fourth and fifth transistors to select between normal and muting operations.

11. The signal processing circuit of claim 4, further comprising a second differential amplifier comprising third and fourth transistors and a third constant current source connected to said third and fourth transistors; a fifth transistor connected in parallel to said first transistor; a sixth transistor connected between said load circuit and said third current source; and a reference voltage source connected to a base of said third transistor, wherein said input signals comprise a pair of signals varying in level 180° out of phase with respect to one another, a control signal is applied to bases of said fifth and sixth transistors to select between normal and muting operations, and a signal to be superimposed on said output signal is being applied to a base of said fourth transistor.

12. The signal processing device of claim 4, wherein said bypass circuit further comprises third and fourth transistors connected between said load circuit and said first constant current source, wherein said input signals comprise a pair of signals varying in level 180° out of phase with respect to one another, a control signal is applied to a base of said third transistor to select between normal and muting operations, and a signal to be superimposed on said output signal is applied to a base of said fourth transistor.

13. The signal processing device of claim 12, wherein said load circuit comprises first through third resistors connected in series with one another, in the order stated, between a power source terminal and a collector of said second transistor, a collector of said third transistor is connected to a connection point between said first and second resistors, and wherein a collector of said fourth transistor is connected to a connection point between said second and third resistors.

14. The signal processing circuit of claim 4, further comprising: a second differential amplifier comprising third and fourth transistors and a third constant current source connected to said third and fourth transistors; a reference voltage source connected to a base of said third transistor; and a fifth transistor connected in parallel to said first transistor, wherein a control signal is applied to bases of said fourth and fifth transistors to select between normal and muting operations.

* * * * *